(12) United States Patent
Goto et al.

(10) Patent No.: US 8,507,117 B2
(45) Date of Patent: Aug. 13, 2013

(54) LITHIUM ION SECONDARY BATTERY, ASSEMBLED BATTERY, VEHICLE, BATTERY-EQUIPPED DEVICE, BATTERY SYSTEM, AND METHOD FOR DETECTING DETERIORATION OF LITHIUM ION SECONDARY BATTERY

(75) Inventors: Satoshi Goto, Miyoshi (JP); Hiroshi Hamaguchi, Toyota (JP); Yoshiyuki Ryogoku, Toyota (JP); Aiko Nagano, Nagoya (JP); Takashi Kuzuya, Nagoya (JP)

(73) Assignee: Toyota Jidosha Kabushiki Kaisha, Toyota-shi, Aichi-ken (JP)

(*) Notice: Subject to any disclaimer, the term of this patent is extended or adjusted under 35 U.S.C. 154(b) by 222 days.

(21) Appl. No.: 12/841,223

(22) Filed: Jul. 22, 2010

(65) Prior Publication Data

US 2010/0285349 A1 Nov. 11, 2010

Related U.S. Application Data

(63) Continuation of application No. PCT/JP2009/051065, filed on Jan. 23, 2009.

(30) Foreign Application Priority Data

Jan. 24, 2008 (JP) ................... 2008-014245

(51) Int. Cl.
*H01M 10/48* (2006.01)

(52) U.S. Cl.
USPC ......... 429/90; 429/161; 429/179; 429/231.95

(58) Field of Classification Search
USPC ............... 429/90, 161, 163, 179, 188, 211, 429/231.95, 324–343
See application file for complete search history.

(56) References Cited

U.S. PATENT DOCUMENTS

| | | | |
|---|---|---|---|
| 2003/0195719 A1 | 10/2003 | Emori et al. | |
| 2004/0137326 A1* | 7/2004 | Munshi | 429/231.4 |
| 2004/0241543 A1* | 12/2004 | Miyake et al. | 429/188 |
| 2005/0119856 A1 | 6/2005 | Emori et al. | |
| 2009/0104510 A1* | 4/2009 | Fulop et al. | 429/50 |
| 2010/0085015 A1* | 4/2010 | Hamaguchi et al. | 320/134 |

FOREIGN PATENT DOCUMENTS

| | | |
|---|---|---|
| CN | 1650465 | 8/2005 |
| EP | 1 353 191 A2 | 10/2003 |
| JP | 52-145734 | 12/1977 |
| JP | 1-288784 | 11/1989 |
| JP | 6-337284 | 12/1994 |
| JP | 2000-21441 | 1/2000 |
| JP | 2001-338677 | 12/2001 |
| JP | 2002-231316 | 8/2002 |
| JP | 2003-303627 | 10/2003 |
| JP | 2009-176575 | 8/2009 |
| WO | WO 2009093723 A1 * | 7/2009 |

OTHER PUBLICATIONS

International Search Report in International Application PCT/JP2009/051065, Mailing Date: Mar. 24, 2009.

* cited by examiner

*Primary Examiner* — Basia Ridley
*Assistant Examiner* — Heng Chan
(74) *Attorney, Agent, or Firm* — Finnegan, Henderson, Farabow, Garrett & Dunner, LLP

(57) ABSTRACT

Provided are a lithium-ion secondary battery capable of measuring the concentration of lithium ions in an stored electrolyte in a predetermined portion, an assembled battery using the same, a vehicle and a battery-equipped device equipped with the battery or the assembled battery, a battery system capable of acquiring the concentration-correlated physical quantity in the lithium-ion secondary battery, and a method for detecting the deterioration of the lithium-ion secondary battery. A lithium-ion secondary battery comprises a power generation element including a positive electrode plate and a negative electrode plate, a battery case housing the power generation element, and an electrolyte containing lithium ions and held in the battery case, and further comprises a stored-electrolyte physical quantity measuring means capable of measuring the concentration-correlated physical quantity having a correlation to the concentration of lithium ions in the stored electrolyte stored between the element and the case.

11 Claims, 28 Drawing Sheets ial Patent
LITHIUM ION SECONDARY BATTERY, ASSEMBLED BATTERY, VEHICLE, BATTERY-EQUIPPED DEVICE, BATTERY SYSTEM, AND METHOD FOR DETECTING DETERIORATION OF LITHIUM ION SECONDARY BATTERY

CROSS-REFERENCE TO RELATED APPLICATIONS

This application is a continuation application based upon and claims the benefit of the prior PCT International Patent Application No. PCT/JP2009/051065 filed on Jan. 23, 2009, and claims the priority of Japanese Application No. 2008-014245, filed Jan. 24, 2008, the entire contents of both of which are incorporated herein by reference.

TECHNICAL FIELD

The present invention relates to a lithium ion secondary battery, an assembled battery (a battery pack), a vehicle, a battery-equipped device, a battery system, each including the secondary battery, and a method for detecting deterioration of a lithium ion secondary battery.

BACKGROUND ART

Recently, lithium ion secondary batteries are used for driving power sources of hybrid electric vehicles and portable electronic devices such as a notebook-size personal computer and a video camcorder.

For example, Patent Literature 1 discloses a lithium ion secondary battery including $LiPF_6$ as a nonaqueous electrolyte (an electrolytic solution) in which the concentration of lithium salt is regulated to 0.4 to 0.8 mol/l.

CITATION LIST

Patent Literature

Patent Literature 1: JP 2000-21441A

SUMMARY OF INVENTION

Technical Problem

The present inventors found that, in a lithium ion secondary battery having an internal resistance increased with deterioration of the battery, the concentration of lithium ions in an electrolyte (an electrolytic solution) retained between a positive electrode plate and a negative electrode plate of a power generating element lowers than in that at the time of battery manufacture. They also found that, in a lithium ion secondary battery in which a larger amount of electrolyte than the electrolyte retained in the power generating element is poured in a battery case, the concentration of lithium ions (also referred to as "lithium ion concentration") in the stored electrolyte stored outside the power generating element in the battery case becomes higher as the battery deteriorates. As described above, this also conforms to lowering of the lithium ion concentration of the electrolyte retained between the positive electrode plate and the negative electrode plate of the power generating element.

The present invention has been made under such circumstances and has a purpose to provide a lithium ion secondary battery enabling measurement of the lithium ion concentration in electrolyte in a predetermined portion, an assembled battery using the same, a vehicle and a battery-equipped device equipped with the assembled battery, a battery system capable of acquiring the concentration-correlated physical quantity in the lithium ion secondary battery, and a method for detecting the deterioration of the lithium ion secondary battery.

Solution to Problem

To achieve the above purpose, one aspect of the invention provides a lithium ion secondary battery comprising: a power generating element having a positive electrode plate and a negative electrode plate; a battery case housing the power generating element; and an electrolyte containing lithium ions, the electrolyte being retained in the battery case, wherein the electrolyte includes: a retained electrolyte as a part retained between the positive electrode plate and the negative electrode plate in the power generating element; and a stored electrolyte as another part stored between the power generating element and the battery case so that the stored electrolyte and the retained electrolyte are allowed to communicate with each other, the lithium ion secondary battery comprises stored-electrolyte physical quantity measuring means capable of measuring a concentration correlated physical quantity having a correlation with concentration of the lithium ions in the stored electrolyte.

The lithium ion secondary battery in this aspect includes the stored-electrolyte physical quantity measuring means capable of measuring the concentration correlated physical quantity of lithium ions related to the stored electrolyte. Accordingly, the lithium ion concentration of the stored electrolyte can be detected from the concentration correlated physical quantity measured by this stored-electrolyte physical quantity measuring means. As described above, the lithium ion concentration of the stored electrolyte increases as the battery deteriorates. Thus, whether or not the lithium ion secondary battery has deteriorated can be easily determined.

The concentration correlated physical quantity may be any physical quantity as long as it has a correlation with the lithium ion concentration of the stored electrolyte. For instance, in the case where a concentration cell is constituted of the above stored electrolyte and the reference electrolyte having a reference lithium ion concentration, an electromotive force of that cell may be adopted as the concentration correlated physical quantity. Another alternative is a magnitude of resistance between two electrodes being placed in spaced relation to each other and contacting with the above stored electrolytes respectively.

The stored-electrolyte physical quantity measuring means may be arranged for example such that, the stored electrolyte and the reference electrolyte having the reference lithium ion concentration are placed by interposing a separator therebetween so that a first measurement electrode contacting with the stored electrolyte and a second measurement electrode contacting with the reference electrolyte are placed. Another alternative is to provide two electrodes placed apart from each other and in contact with the stored electrolyte.

Furthermore, the above lithium ion secondary battery, preferably, comprises a liquid retaining member for retaining the stored electrolyte so as to communicate with the retained electrolyte even when the lithium ion secondary battery is placed at a slant and so as to contact with a contact-requiring portion of the stored-electrolyte physical quantity measuring means required to contact with the stored electrolyte.

Since the lithium ion secondary battery includes the liquid retaining member, the lithium ion concentration of the stored electrolyte can be measured appropriately by use of the stored-electrolyte physical quantity measuring means even when the lithium ion secondary battery is placed at a slant.

The liquid retaining member may include a porous body made of insulating resin such as a sponge and a porous body made of insulating ceramics, each being capable of absorbing the stored electrolyte, for example. Furthermore, another alternative is to provide a liquid trap member capable of retaining the stored electrolyte around a contact-requiring portion of the stored-electrolyte physical quantity measuring means in the battery case even when the battery case is placed at a slant.

Furthermore, in one of the above lithium ion secondary batteries, preferably, the stored-electrolyte physical quantity measuring means comprises: a first measurement electrode including a first electrode main part contacting with the stored electrolyte and a first conductive part exposed to the outside of the battery case and electrically connected to the first electrode main part; a reference electrolyte containing lithium ions of a reference concentration; a reference electrolyte container containing the reference electrolyte; a second measurement electrode including a second electrode main part contacting with the reference electrolyte and a second conductive part exposed to the outside of the reference electrolyte container and electrically connected to the second electrode main part; and a separating member having a first surface that contacts with the stored electrolyte and a second surface that contacts with the reference electrolyte to separate the stored electrolyte and the reference electrolyte from each other, the separating member being arranged to prevent ion migration between the first and second surfaces resulting from a concentration difference between the stored electrolyte and the reference electrolyte and measure a voltage generated between the reference electrolyte and the stored electrolyte by the first and second measurement electrodes.

Alternatively, in the above lithium ion secondary battery, preferably, the stored-electrolyte physical quantity measuring means comprises: a first measurement electrode including a first electrode main part immersed in the stored electrolyte and a first conductive part exposed to the outside of the battery case and electrically connected to the first electrode main part; a reference electrolyte containing lithium ions of a reference concentration; a reference electrolyte container containing the reference electrolyte; a second measurement electrode including a second electrode main part immersed in the reference electrolyte and a second conductive part exposed to the outside of the reference electrolyte container and electrically connected to the second electrode main part; and a separating member having a first surface that contacts with the stored electrolyte and a second surface that contacts with the reference electrolyte to separate the stored electrolyte and the reference electrolyte from each other, the separating member being arranged to prevent ion migration between the first and second surfaces resulting from a concentration difference between the stored electrolyte and the reference electrolyte and measure a voltage generated between the reference electrolyte and the stored electrolyte by the first and second measurement electrodes.

The lithium ion secondary batteries in the above two configurations includes, as the stored-electrolyte physical quantity measuring means, the first measurement electrode contacting with or immersed in the stored electrolyte and the second measurement electrode contacting with or immersed in the reference electrolyte. Thus, the lithium ion concentration of the stored electrolyte can be obtained from the magnitude of electromotive force between the first and second measurement electrodes and the known lithium ion concentration of the reference electrolyte. Accordingly, whether or not the battery has deteriorated can be easily and reliably determined.

The separating member is a member capable of preventing ion migration between the first and second surfaces resulting from a concentration difference between the stored electrolyte and the reference electrolyte and also measuring of the voltage generated between the reference electrolyte and the stored electrolyte by the first and second measurement electrodes. To be concrete, the separating member may be made of a porous glass (Vycor glass, etc.) having such characteristics, ceramics, or resin.

A configuration of the electrode main part to contact with the electrolyte has only to be electrically connectable to the electrolyte. For instance, the configuration may include that a part of the surface of the first or second electrode main part contacts with the stored electrolyte or the reference electrolyte or that a part of or the whole of first or second electrode main part is immersed in the stored electrolyte or the reference electrolyte.

Furthermore, the above lithium ion secondary battery, preferably, further comprises: a positive current collector being connected to the positive electrode plate and having a part exposed to the outside of the battery case; and a negative current collector being connected to the negative electrode plate and having a part exposed to the outside of the battery case, wherein one of the positive electrode plate and the negative electrode plate is a contact electrode plate having a part that contacts with the stored electrolyte and serving as the first electrode main part of the first measurement electrode, and one of the positive current collector and the negative current collector, the one related to the contact electrode plate, serves as the first conductive part.

In the lithium ion secondary battery in this aspect, one of the positive electrode plate and the negative electrode plate is the contact electrode plate to also be used as the first electrode main part, and one of the positive current collector and the negative current collector related to the contact electrode plate is also used as the first conductive part. Therefore, there is no need to provide the first electrode main part separately from the positive electrode plate or the negative electrode plate and provide the first conductive part separately from the positive current collector or the negative current collector. Thus, the lithium ion secondary battery can be achieved with a simple configuration.

Furthermore, in the above lithium ion secondary battery, preferably, one of the positive electrode plate and the negative electrode plate is the contact electrode plate defined as a narrow potential range electrode plate exhibiting a narrower width between a positive potential range which is a potential changing range of the positive electrode plate and a negative potential range which is a potential changing range of the negative electrode plate when a state of charge of the lithium ion secondary battery is varied in a predetermined range.

In the positive electrode plate and the negative electrode plate, the potential of the positive electrode plate or the potential of the negative electrode plate changes according to the amount of lithium (lithium ions) existing in an active material carried on the electrode plate. Accordingly, when the state of charge of the battery is changed in a predetermined range (e.g., SOC 20% to 80%), the potentials of the positive electrode plate and the negative electrode plate change in the positive potential range and the negative potential range respectively.

In this case, when the electromotive force is measured between one of the positive electrode plate and the negative electrode plate, the one having a larger potential variance (the electrode plate having a larger one between the positive potential range and the negative potential range), and the second measurement electrode, the potential of the relevant electrode plate has great variance if the state of charge during measurement varies. Thus, the electromotive force generated between the relevant electrode plate and the second measurement electrode according to the concentration of the stored electrolyte cannot be precisely measured.

On the other hand, in the lithium ion secondary battery in this aspect, the aforementioned narrow potential range electrode plate, which is one of the positive electrode plate and the negative electrode plate, is used as the contact electrode plate. In addition, this contact electrode plate is also used as the first electrode main part. Even when the state of charge during measurement varies, the potential change in the narrow potential range electrode plate (the contact electrode plate and the first electrode main part) is small. Consequently, the use of this narrow potential range electrode plate enables precise measurement of the electromotive force between the relevant electrode plate and the second measurement electrode.

Alternatively, in one of the above lithium ion secondary batteries, preferably, the stored-electrolyte physical quantity measuring means comprises: a first measurement electrode including a first electrode main part that contacts with the stored electrolyte and a first conductive part exposed to the outside of the battery case and electrically connected to the first electrode main part; and a second measurement electrode including a second electrode main part that is separately placed from the first electrode main part and contacts with the stored electrolyte and a second conductive part exposed to the outside of the battery case and electrically connected to the second electrode main part.

Alternatively, in the above lithium ion secondary battery, preferably, the stored-electrolyte physical quantity measuring means comprises a first measurement electrode including a first electrode main part immersed in the stored electrolyte and a first conductive part exposed to the outside of the battery case and electrically connected to the first electrode main part, and a second measurement electrode including a second electrode main part placed apart from the first electrode main part and immersed in the stored electrolyte and a second conductive part exposed to the outside of the battery case and electrically connected to the second electrode main part.

In the lithium ion secondary batteries in the above two configurations, the stored-electrolyte physical quantity measuring means has the first and second measurement electrodes both contacting with or being immersed in the stored electrolyte. When a voltage is applied between the first measurement electrode and the second measurement electrode, accordingly, a current according to a resistance between both electrodes is caused to flow. The magnitude of this resistance changes according to an electric conductivity of the stored electrolyte and this electric conductivity changes according to the lithium ion concentration of the stored electrolyte. In other words, the magnitude of resistance caused between the first measurement electrode and the second measurement electrode and the lithium ion concentration of the stored electrolyte have a correlation. Accordingly, the lithium ion concentration of the stored electrolyte can be ascertained based on the magnitude of resistance between the first and second measurement electrodes, the magnitude of current caused to flow between the first and second measurement electrodes when a constant voltage is applied therebetween, or the magnitude of voltage generated between the first and second measurement electrodes when a constant current is supplied therebetween. Thus, whether or not the battery has deteriorated can be easily and reliably determined.

Furthermore, another aspect of the invention provides at least one of the lithium ion secondary batteries is one of the aforementioned lithium ion secondary batteries.

In the assembled battery in this aspect, at least one of the batteries used therein is the aforementioned lithium ion secondary battery including the aforementioned physical quantity measuring means. By acquiring the concentration correlated physical quantity of that lithium ion secondary battery, the degree of deterioration of the lithium ion secondary battery and hence the degree of deterioration of each lithium ion secondary battery used in the assembled battery can be easily estimated.

In the above assembled battery, preferably, one of the lithium ion secondary batteries constituting the assembled battery, the one being to have a minimum temperature when the assembled battery is charged and discharged, is the lithium ion secondary battery including the physical quantity measuring means.

In charging and discharging the lithium ion secondary battery with a relatively large current (high rate current), the present inventors found that an increase in internal resistance of that battery (high rate deterioration) is accelerated when the temperature of the battery is low.

In the assembled battery in this aspect, on the other hand, the minimum-temperature battery of the lithium ion secondary batteries in the assembled battery is the aforementioned lithium ion secondary battery. It is thus possible to measure the concentration of the electrolyte in the minimum-temperature battery tending to deteriorate at a highest rate. This makes it possible to not only ascertain the degree of high rate deterioration in this minimum-temperature battery but also appropriately estimate the degree of high rate deterioration of each battery used in the assembled battery.

Furthermore, another aspect of the invention provides a vehicle mounting one of the aforementioned lithium ion secondary batteries or one of the aforementioned assembled batteries.

In the vehicle in this aspect, the mounted lithium ion secondary battery or at least one of the plurality of lithium ion secondary batteries used in the mounted assembled battery is the aforementioned lithium ion secondary battery. Accordingly, at appropriate timing such as during nonuse or automobile inspection of the vehicle, for example, the concentration correlated physical quantity of this lithium ion secondary battery can be acquired. This makes it possible to ascertain the degree of deterioration of this lithium ion secondary battery or the degree of deterioration of each lithium ion secondary battery constituting the assembled battery by combination with the above lithium ion secondary battery. In the vehicle in this aspect, whether or not the mounted lithium ion secondary battery or the assembled battery has deteriorated can be easily estimated.

Furthermore, another aspect of the invention provides a battery-equipped device mounting one of the aforementioned lithium ion secondary batteries or one of the aforementioned assembled batteries.

In the battery-equipped device in this aspect, the mounted lithium ion secondary battery or at least one of the plurality of lithium ion secondary batteries used in the mounted assembled battery is the aforementioned lithium ion secondary battery. Accordingly, for example, at appropriate timing such as during nonuse or repair and check of this battery-equipped device, the concentration correlated physical quantity of this lithium ion secondary battery can be acquired. This makes it possible to ascertain the degree of deterioration of this lithium ion secondary battery or the degree of deterioration of each lithium ion secondary battery constituting the assembled battery by combination with the above lithium ion secondary battery. In the battery-equipped device in this aspect, therefore, whether or not the mounted lithium ion secondary battery or the assembled battery has deteriorated can be easily estimated.

Furthermore, another aspect of the invention provides a battery system comprising: one of the aforementioned lithium ion secondary batteries; and acquiring means for acquiring the concentration correlated physical quantity by use of the stored-electrolyte physical quantity measuring means.

The battery system in this aspect includes the aforementioned lithium ion secondary battery and the acquiring means. Accordingly, this battery system can acquire the concentration correlated physical quantity and easily detect the degree of deterioration of this battery.

The above battery system preferably comprises an assembled battery having a plurality of lithium ion secondary batteries including the lithium ion secondary battery including the physical quantity measuring means.

The battery system in this aspect includes the assembled battery including the aforementioned lithium ion secondary battery. Since the battery system acquires the concentration correlated physical quantity of this lithium ion secondary battery, it is possible to easily ascertain the degree of deterioration of this lithium ion secondary battery and further the degree of deterioration of each lithium ion secondary battery constituting the assembled battery by combination with the above lithium ion secondary battery.

Furthermore, another aspect of the invention provides a vehicle mounting one of the aforementioned battery systems.

The vehicle in this aspect includes the above battery system. Accordingly, the vehicle in this aspect can acquire the concentration correlated physical quantity of the aforementioned lithium ion secondary battery by the battery system and detect a deterioration condition of this lithium ion secondary battery or further each battery in the assembled battery. Furthermore, the battery or the assembled battery (each battery) can be appropriately used according to its deterioration condition.

Furthermore, another aspect of the invention provides a battery-equipped device mounting one of the aforementioned battery systems.

The battery-equipped device in this aspect includes the above battery system. Accordingly, the battery system in the battery-equipped device in this aspect can acquire the concentration correlated physical quantity of the aforementioned lithium ion secondary battery and detect the deterioration condition of this lithium ion secondary battery or further the deterioration condition of each battery in the assembled battery. Furthermore, the battery or the assembled battery (each battery) can be appropriately used according to respective deterioration conditions.

Furthermore, another aspect of the invention provides a method for detecting deterioration of a lithium ion secondary battery comprising: a power generating element having a positive electrode plate and a negative electrode plate; a battery case housing the power generating element; and an electrolyte containing lithium ions and being retained in the battery case, wherein the electrolyte includes: a retained electrolyte as a part retained between the positive electrode plate and the negative electrode plate in the power generating element; and a stored electrolyte as another part stored between the power generating element and the battery case so that the stored electrolyte and the retained electrolyte are allowed to communicate with each other, and the method comprises a stored-electrolyte measuring step of measuring a concentration of the lithium ions in the stored electrolyte or a concentration correlated physical quantity having a correlation with the concentration.

The method for detecting the deterioration of the lithium ion secondary battery in this aspect includes the aforementioned stored-electrolyte measuring step. By use of the lithium ion concentration of the stored electrolyte obtained in this stored-electrolyte measuring step or the concentration correlated physical quantity, it is possible to easily detect whether or not the lithium ion secondary battery has deteriorated.

In the above method for detecting the deterioration of the lithium ion secondary battery, preferably, the lithium ion secondary battery comprises a liquid retaining member for retaining the stored electrolyte so as to communicate with the retained electrolyte even when the lithium ion secondary battery is placed at a slant and so as to contact with a contact-requiring portion of stored-electrolyte physical quantity measuring means capable of measuring a concentration correlated physical quantity of the stored electrolyte required to contact with the stored electrolyte.

In the method for detecting the deterioration of the lithium ion secondary battery in this aspect, the lithium ion secondary battery includes the liquid retaining member. Even when the lithium ion secondary battery is placed at a slant, the stored electrolyte can be measured by use of the contact-requiring portion of the stored-electrolyte physical quantity measuring means, thereby making sure detection of deterioration of the lithium ion secondary battery.

Preferably, in one of the above methods for detecting the deterioration of the lithium ion secondary battery, the lithium ion secondary battery comprises: a first measurement electrode including a first electrode main part contacting with the stored electrolyte and a first conductive part exposed to the outside of the battery case and electrically connected to the first electrode main part; a reference electrolyte containing lithium ions of a reference concentration; a reference electrolyte container containing the reference electrolyte; a second measurement electrode including a second electrode main part contacting with the reference electrolyte and a second conductive part exposed to the outside of the reference electrolyte container and electrically connected to the second electrode main part; and a separating member having a first surface that contacts with the stored electrolyte and a second surface that contacts with the reference electrolyte to separate the stored electrolyte and the reference electrolyte from each other, the separating member being arranged to prevent ion migration between the first and second surfaces resulting from a concentration difference between the stored electrolyte and the reference electrolyte and measure a voltage generated between the reference electrolyte and the stored electrolyte by the first and second measurement electrodes, and the stored electrolyte measuring step includes measuring a magnitude of electromotive force generated between the first measurement electrode and the second measurement electrode as the concentration correlated physical quantity.

Alternatively, in the method for detecting the deterioration of the lithium ion secondary battery in this aspect, preferably, the lithium ion secondary battery comprises: a first measurement electrode including a first electrode main part immersed in the stored electrolyte and a first conductive part exposed to the outside of the battery case and electrically connected to the first electrode main part; a reference electrolyte containing lithium ions of a reference concentration; a reference electrolyte container containing the reference electrolyte; a second measurement electrode including a second electrode main part immersed in the reference electrolyte and a second conductive part exposed to the outside of the reference electrolyte container and electrically connected to the second electrode main part; and a separating member having a first surface that contacts with the stored electrolyte and a second surface that contacts with the reference electrolyte to separate the stored electrolyte and the reference electrolyte from each other, the separating member being arranged to prevent ion migration between the first and second surfaces resulting from a concentration difference between the stored electrolyte and the reference electrolyte and measure a voltage generated between the reference electrolyte and the stored electrolyte by the first and second measurement electrodes, and the stored electrolyte measuring step includes measuring a magnitude of electromotive force generated between the first measurement electrode and the second measurement electrode as the concentration correlated physical quantity.

In the methods for detecting the deterioration of the lithium ion secondary battery in the above two configurations, the magnitude of electromotive force generated between the first and second measurement electrodes is measured in the stored electrolyte measuring step. The magnitude of this electromotive force has a correlation with the lithium ion concentration of the stored electrolyte. Accordingly, the degree of deterioration of the lithium ion secondary battery can be easily ascertained based on this magnitude of electromotive force.

In one of the above methods for detecting the deterioration of the lithium ion secondary battery, preferably, the lithium ion secondary battery comprises: a positive current collector being connected to the positive electrode plate and having a part exposed to the outside of the battery case; and a negative current collector being connected to the negative electrode plate and having a part exposed to the outside of the battery case, wherein one of the positive electrode plate and the negative electrode plate is a contact electrode plate having a part that contacts with the stored electrolyte and serving as the first electrode main part of the first measurement electrode, and one of the positive current collector and the negative current collector, the one related to the contact electrode plate, serves as the first conductive part.

In the method for detecting the deterioration of the lithium ion secondary battery in this aspect, one of the positive electrode plate and the negative electrode plate is the contact electrode plate also used as the first electrode main part, and one of the positive current collector and the negative current collector relating the contact electrode plate is also used as the first conductive part. Accordingly, there is no need to provide the first electrode main part separately from the positive electrode plate or the negative electrode plate and provide the first conductive part separately from the positive current collector or the negative current collector, so that the deterioration of the lithium ion secondary battery can be detected with a simple configuration.

In the above method for detecting the deterioration of the lithium ion secondary battery, preferably, one of the positive electrode plate and the negative electrode plate is the contact electrode plate defined as a narrow potential range electrode plate exhibiting a narrower width between a positive potential range which is a potential changing range of the positive electrode plate and a negative potential range which is a potential changing range of the negative electrode plate when a state of charge of the lithium ion secondary battery is varied in a predetermined range and the positive potential range.

In the method for detecting the deterioration of the lithium ion secondary battery in this aspect, one of the positive electrode plate and the negative electrode plate is the contact electrode plate defined as the narrow potential range electrode plate. In addition, this contact electrode plate is also used as the first electrode main part. Accordingly, the variance in the potential of the narrow potential range electrode plate (the contact electrode plate and the first electrode main part) according to a change in state of charge is small. Thus, the electromotive force between the narrow potential range electrode plate (the first electrode main part) and the second measurement electrode can be precisely measured and hence the deterioration of the lithium ion secondary battery can be detected more appropriately.

Alternatively, in one of the above methods for detecting the deterioration of the lithium ion secondary battery, preferably, the lithium ion secondary battery comprises: a first measurement electrode including a first electrode main part that contacts with the stored electrolyte and a first conductive part exposed to the outside of the battery case and electrically connected to the first electrode main part; and a second measurement electrode including a second electrode main part that is separately placed from the first electrode main part and contacts with the stored electrolyte and a second conductive part exposed to the outside of the battery case and electrically connected to the second electrode main part, the stored electrolyte measuring step includes measuring, as the concentration correlated physical quantity, at least one of a magnitude of resistance caused between the first electrode main part and the second electrode main part, a magnitude of current caused to flow when a constant voltage is applied between the first electrode main part and the second main part, and a magnitude of voltage generated between the first electrode main part and the second electrode main part when a constant current is supplied between the first electrode main part and the second electrode main part.

Alternatively, in the above method for detecting the deterioration of the lithium ion secondary battery, preferably, the lithium ion secondary battery comprises: a first measurement electrode including a first electrode main part that immersed in the stored electrolyte and a first conductive part exposed to the outside of the battery case and electrically connected to the first electrode main part; and a second measurement electrode including a second electrode main part that is separately placed from the first electrode main part and immersed in the stored electrolyte and a second conductive part exposed to the outside of the battery case and electrically connected to the second electrode main part, the stored electrolyte measuring step includes measuring, as the concentration correlated physical quantity, at least one of a magnitude of resistance caused between the first electrode main part and the second electrode main part, a magnitude of current caused to flow when a constant voltage is applied between the first electrode main part and the second main part, and a magnitude of voltage generated between the first electrode main part and the second electrode main part when a constant current is supplied between the first electrode main part and the second electrode main part.

In the methods for detecting the deterioration of the lithium ion secondary battery in the above two configurations, the magnitude of at least one of the resistance, current, and voltage is measured by use of the first and second measurement electrodes in the stored electrolyte measuring step. Such magnitude of the resistance, current, or voltage has a correlation with the lithium ion concentration of the stored electrolyte. Based on those magnitudes, accordingly, the degree of deterioration of the lithium ion secondary battery can be easily detected.

Figure 1:
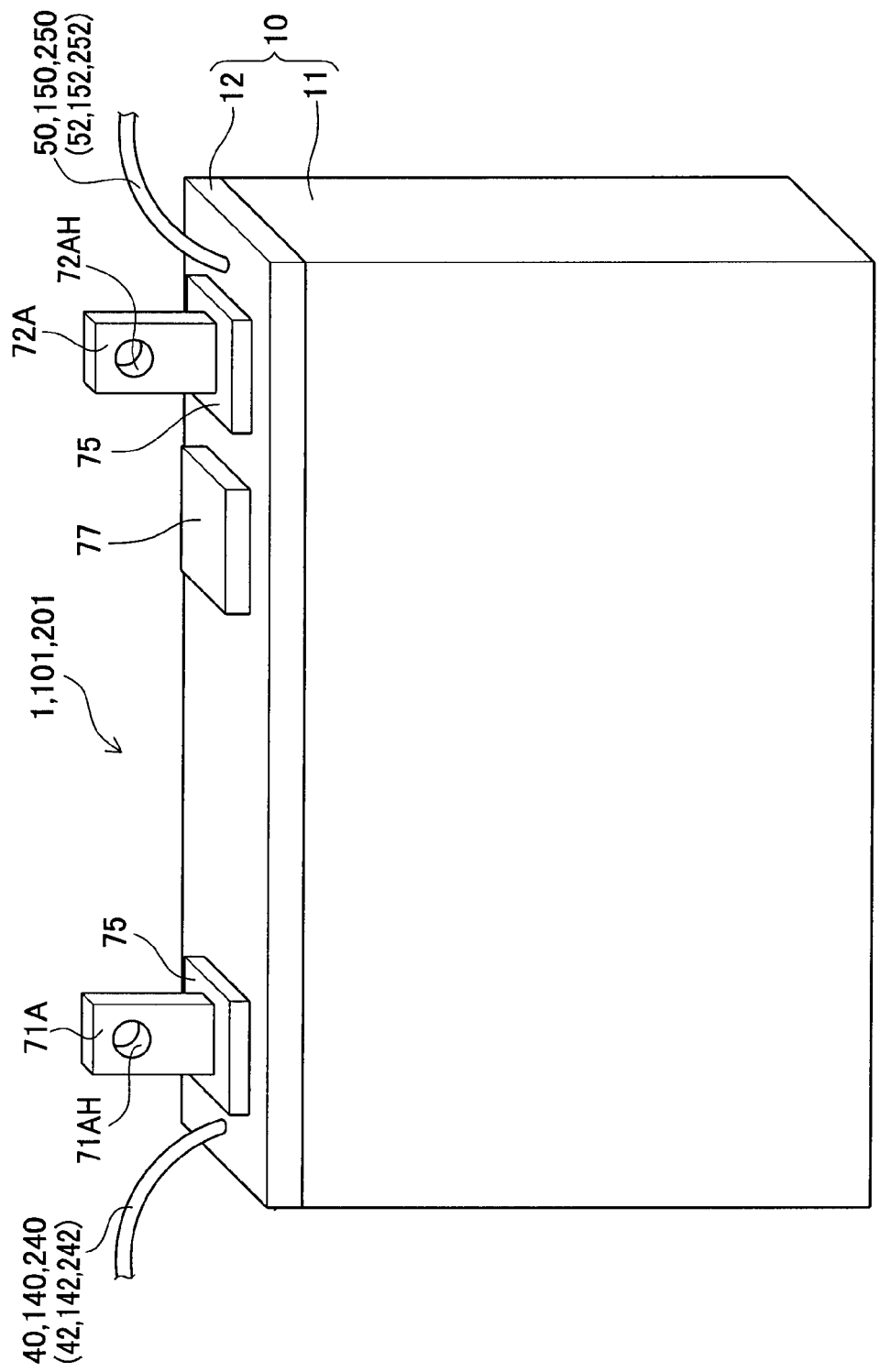
FIG. 1 is a perspective view of a battery in a first embodiment, a first modified embodiment, and a reference embodiment.

REFERENCE SIGNS LIST 1, 101, 301 Battery (Lithium-ion secondary battery)
2 Lithium-ion secondary battery (having no function of measuring concentration)
10 Battery case
20 Power generating element
21 Positive electrode plate
22 Negative electrode plate (First electrode main part, Contact electrode plate, Narrow potential range electrode plate)
23 Separator
30 Electrolyte
30H Retained electrolyte
30S Stored electrolyte
40, 140 First measurement electrode
41, 141 First electrode main part
42, 142 First conductive wire (First conductive part)
50, 150 Second measurement electrode
51, 151 Second electrode main part
52, 152 Second conductive wire (Second conductive part)
60 Reference electrolyte
61 Cylindrical container
61B Bottom
71 Positive current collector
72 Negative current collector (First conductive part, Current collector)
80 Filter (Separating member, Contact-requiring portion)
80a First surface (of filter)
80b Second surface (of filter)
335 Sponge (Liquid retaining member)
400, 700, 1000 Assembled battery
500, 800, 1100 Vehicle
600, 900 Notebook-size personal computer (Battery-equipped device)
610, 910 Battery pack (Assembled battery)
721A Electromotive force acquiring circuit (Acquiring means)
M1, M4 Concentration-difference electromotive-force measuring means (Stored-electrolyte physical quantity measuring means)
M2 Stored-electrolyte resistance measuring means (Stored-electrolyte physical quantity measuring means)
MN Minimum temperature battery
SV1, SV2 Vehicle battery system (Battery system)
SP1 PC battery system (Battery system)
DVP Positive potential range
DVN Negative potential range

DESCRIPTION OF EMBODIMENTS

First Embodiment

A detailed description of a first preferred embodiment of the present invention will now be given referring to the accompanying drawings.

Figure 2:
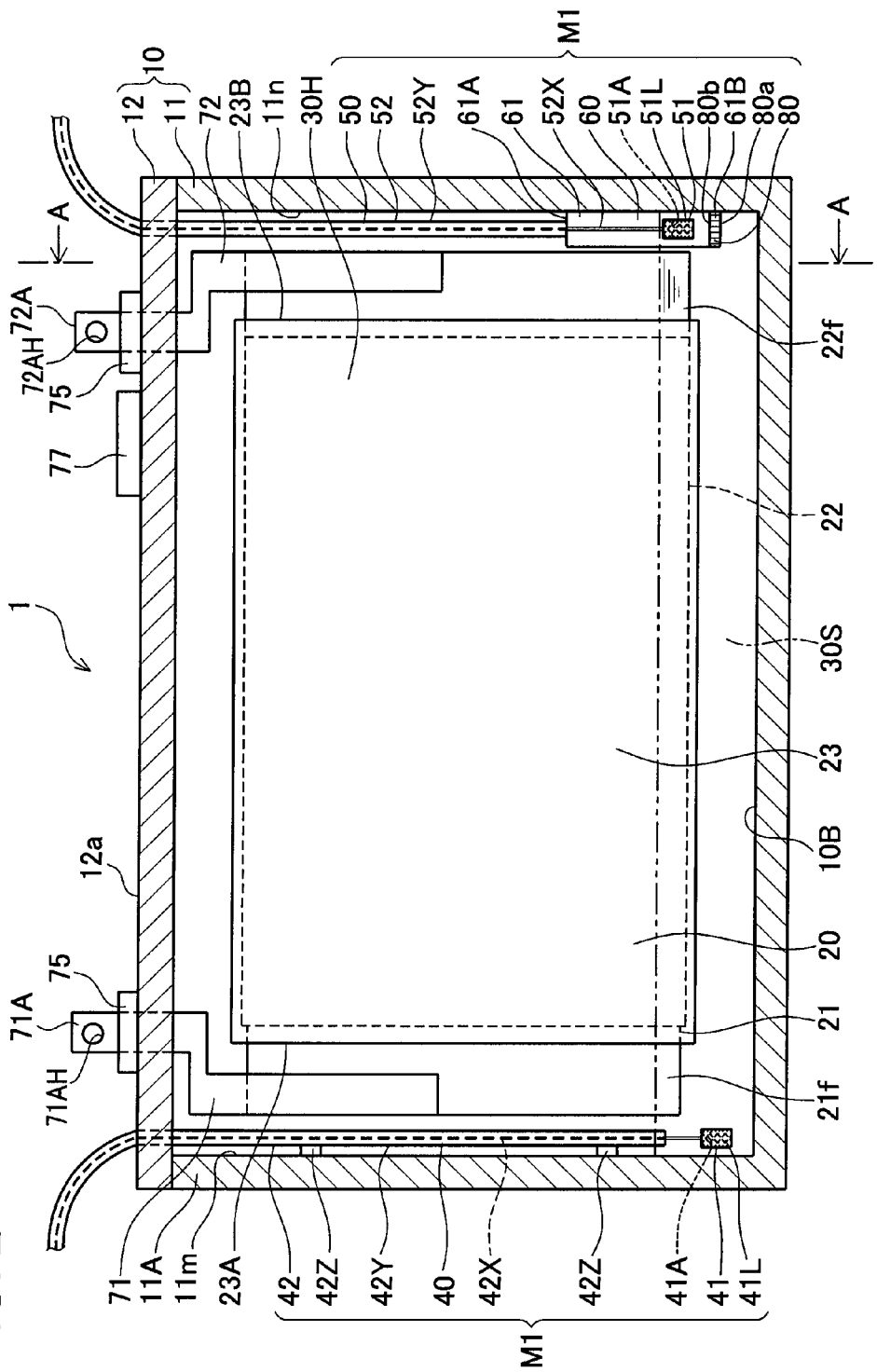
FIG. 2 is a partial cross sectional view of the battery in the first embodiment.
Figure 3:
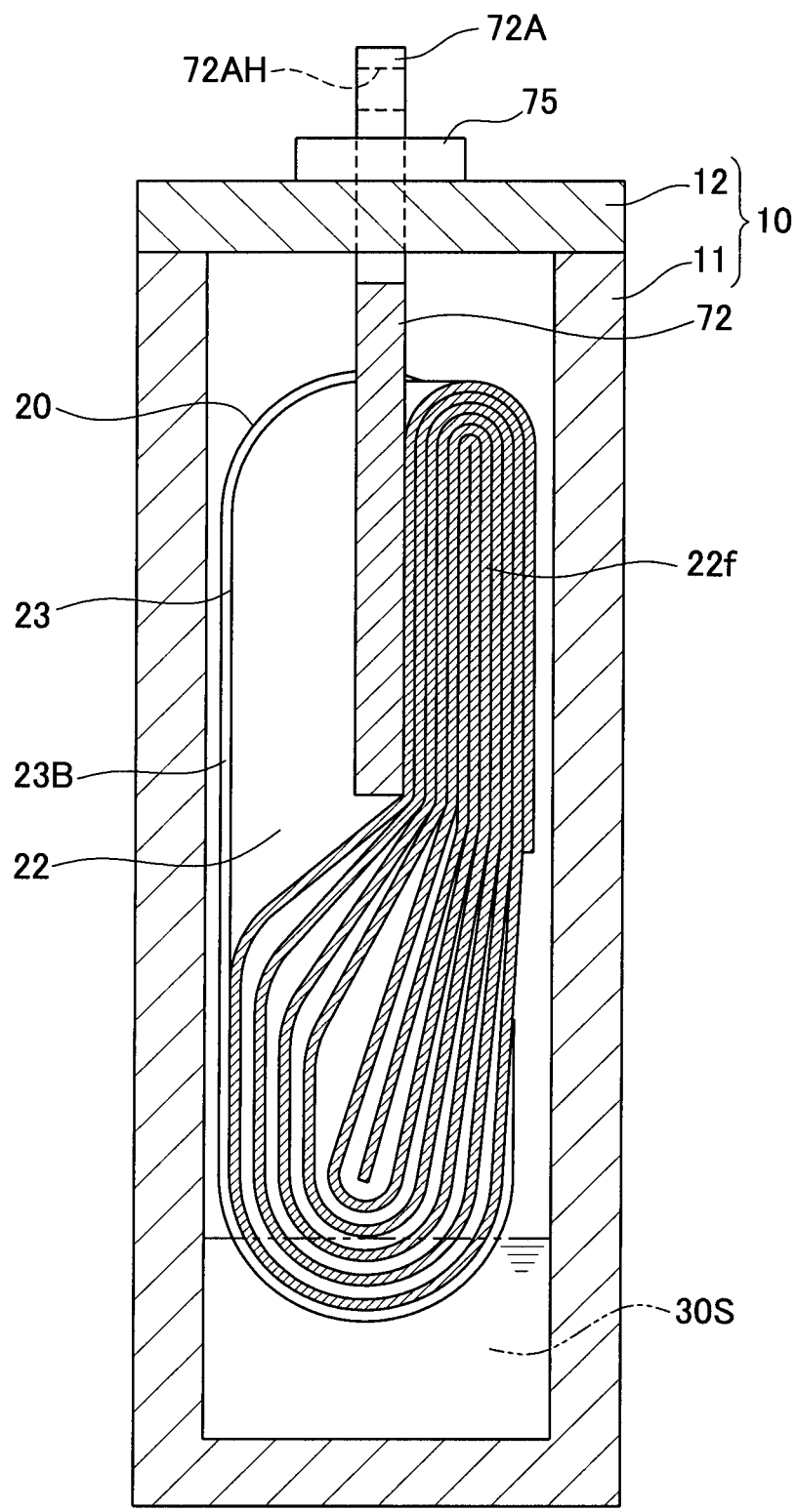
FIG. 3 is a cross sectional view (along a line A-A in FIG. 2) of the battery in the first embodiment.

A battery 1 in the first embodiment is first explained. FIG. 1 is a perspective view of the battery 1; FIG. 2 is a partial cross sectional view of the battery 1; and FIG. 3 is a cross sectional view (along a line A-A in FIG. 2) of the battery 1.

The battery 1 in the first embodiment is a wound-type lithium ion secondary battery including a concentration-difference electromotive-force measuring means M1 in addition to a rectangular box battery case 10, a power generating element 20, and an electrolyte 30.

Of them, the battery case 10 has a battery case body 11 and a closing lid 12 each being made of stainless steel. The battery case body 11 is of a bottom-closed rectangular cylindrical shape and an inner surface overall covered with an insulation film made of resin not shown.

The closing lid 12 is of a rectangular plate shape that closes an opening 11A of the battery case body 11 and is welded to this case body 11. In this closing lid 12, a positive terminal part 71A and a negative terminal part 72A respectively positioned at ends of a positive current collector 71 and a negative current collector 72 connected to the power generating element 20 mentioned later are inserted to protrude from an upper surface 12a. Between each of the positive terminal part 71A and the negative terminal part 72A and the closing lid 12, an insulation member 75 made of resin is interposed for their mutual insulation.

In the closing lid 12, furthermore, a first conductive wire 42 of a first measurement electrode 40 and a second conductive wire 52 of a second measurement electrode 50, each being mentioned later, are inserted to protrude from the upper surface 12a. To this closing lid 12, a safety valve 77 having a rectangular plate shape is also sealingly attached.

The power generating element 20 is made by winding a strip-shaped positive electrode plate 21 and a strip-shaped negative electrode plate 22 while interposing therebetween a strip-shaped separator 23 made of polyethylene so that they are formed in a flat shape (see FIG. 3). These positive electrode plate 21 and negative electrode plate 22 of the power generating element 20 are respectively joined to the plate-like positive current collector 71 and the plate-like negative current collector 72 each being bent in a crank form. To be concrete, as shown in FIG. 3, of the negative electrode plate 22, about half (an upper part in FIG. 3) of a negative lead part 22f made of copper foil and located to protrude from a second end 23B of the separator 23 is welded in close contact with the negative current collector 72. A positive lead part 21f of the positive electrode plate 21 is similarly welded to the positive current collector 71.

The positive electrode plate 21 made of a strip-shaped aluminum foil carries a positive active material layer not shown on both surfaces so that the positive lead part 21f extending along one side is exposed. This positive active material layer contains lithium nickel oxide ($LiNiO_2$) as the positive active material, acetylene black as a conductive agent, and polytetrafluoroethylene (PTFE) and carboxymethyl cellulose (CMC) as a binding agent. A weight ratio of these in the positive active material layer is that $LiNiO_2$ is 90 wt %, acetylene black is 7 wt %, PTFE is 1 wt %, and CMC is 2 wt %.

The negative electrode plate 22 made of a strip-shaped copper foil carries a negative active material layer not shown on both surfaces so that the negative lead part 22f extending along one side is exposed. This negative active material layer contains graphite and a binding agent.

The electrolyte 30 is an organic electrolyte produced by preparing ethylene carbonate (EC) and ethyl methyl carbonate (EMC) at a volume ratio of EC:EMC=3:7 to make a mixed organic solvent, and then adding $LiPF_6$ as dissolved substance to the mixed organic solvent so that the concentration of lithium ions is 1 mol/l.

In this first embodiment, this electrolyte 30 is classified by portions retaining the electrolyte. Specifically, an electrolyte retained between the positive electrode plate 21 and the negative electrode plate 22 in the above power generating element 20 is referred to as a retained electrolyte 30H. When a larger amount of electrolyte than an amount of electrolyte retained in the power generating element 20 is poured into the battery case 10, as shown in FIG. 2, the electrolyte is stored in a lower part 10B in the battery case 10 between the power generating element 20 and the battery case 10, so that this electrolyte is allowed to communicate with the retained electrolyte 30H. This electrolyte is referred to as a stored electrolyte 30S.

The concentration-difference electromotive-force measuring means M1 is explained below. This measuring means M1 includes the first measurement electrode 40 immersed in the stored electrolyte 30S, a reference electrolyte 60, a cylindrical container 61 containing the reference electrolyte 60, a second measurement electrode 50 immersed in the reference electrolyte 60, and a filter 80 for separating the stored electrolyte 30S and the reference electrolyte 60 from each other.

The first measurement electrode 40 includes a first electrode main part 41 carrying a first metal plate 41L made of metal lithium on both surfaces of a rectangular mesh-shaped carrier 41A made of nickel, and a first conductive wire 42. The second measurement electrode 50 includes a second electrode main part 51 carrying a second metal plate 51L made of metal lithium on both surfaces of a rectangular mesh-shaped carrier 51A made of nickel, and a second conductive wire 52. The first conductive wire 42 is covered with a coating member 42Y made of insulation resin to surround a nickel wire 42X electrically connected to the electrode main part 41. The second conductive wire 52 is covered with a coating member 52Y made of insulation resin to surround a nickel wire 52X electrically connected to the electrode main part 51.

The first electrode main part 41 of the first measurement electrode 40 is immersed in the above stored electrolyte 30S. On the other hand, the second measurement electrode 50 is arranged so that the second electrode main part 51 and a part of the second conductive wire 52 are placed in the cylindrical container 61 made of glass. This cylindrical container 61 encapsulates the reference electrolyte 60 having the same component as the above electrolyte 30, that is, an electrolyte produced by preparing ethylene carbonate (EC) and ethyl methyl carbonate (EMC) at a volume ratio of EC:EMC=3:7 to make a mixed organic solvent, and then adding $LiPF_6$ as dissolved substance to the mixed organic solvent so that the concentration of lithium ions is 1 mol/l. Accordingly, the second electrode main part 51 of the second measurement electrode 50 is immersed in the reference electrolyte 60 in the cylindrical container 61.

The above cylindrical container 61 is placed with its bottom 61B being immersed in the stored electrolyte 30S as shown in FIG. 2. Meanwhile, the bottom 61B of this cylindrical container 61 is provided with the filter 80 formed of a porous glass plate. This filter 80 serves to prevent ion migration resulting from a concentration difference between the stored electrolyte 30S and the reference electrolyte 60 and also enables measurement of a voltage between the stored electrolyte 30S and the reference electrolyte 60 by the first measurement electrode 40 and the second measurement electrode 50.

The first conductive wire 42 of the first measurement electrode 40 is fixed to a first side wall 11m of the battery case body 11 through two fixing members 42Z made of resin. This prevents the first electrode main part 41 of the first measurement electrode 40 from contacting with the power generating element 20 for example, thus restraining the occurrence of a short circuit in the battery 1. The second conductive wire 52 of the second measurement electrode 50 is fixed with fixing members not shown. On the other hand, the cylindrical container 61 is bonded to a second side wall 11n of the battery case body 11.

Meanwhile, the inventors manufactured batteries having the same configuration as the above battery 1 but different lithium ion concentration of the electrolyte 30 (the stored electrolyte 30S) in each battery case 10.

Each battery was subjected to measurement of electromotive force generated between the first electrode main part 41 and the second electrode main part 51. Specifically, the first conductive wire 42 of the first measurement electrode 40 and the second conductive wire 52 of the second measurement electrode 50 were connected to a voltmeter and a voltage therebetween was measured.

Figure 4:
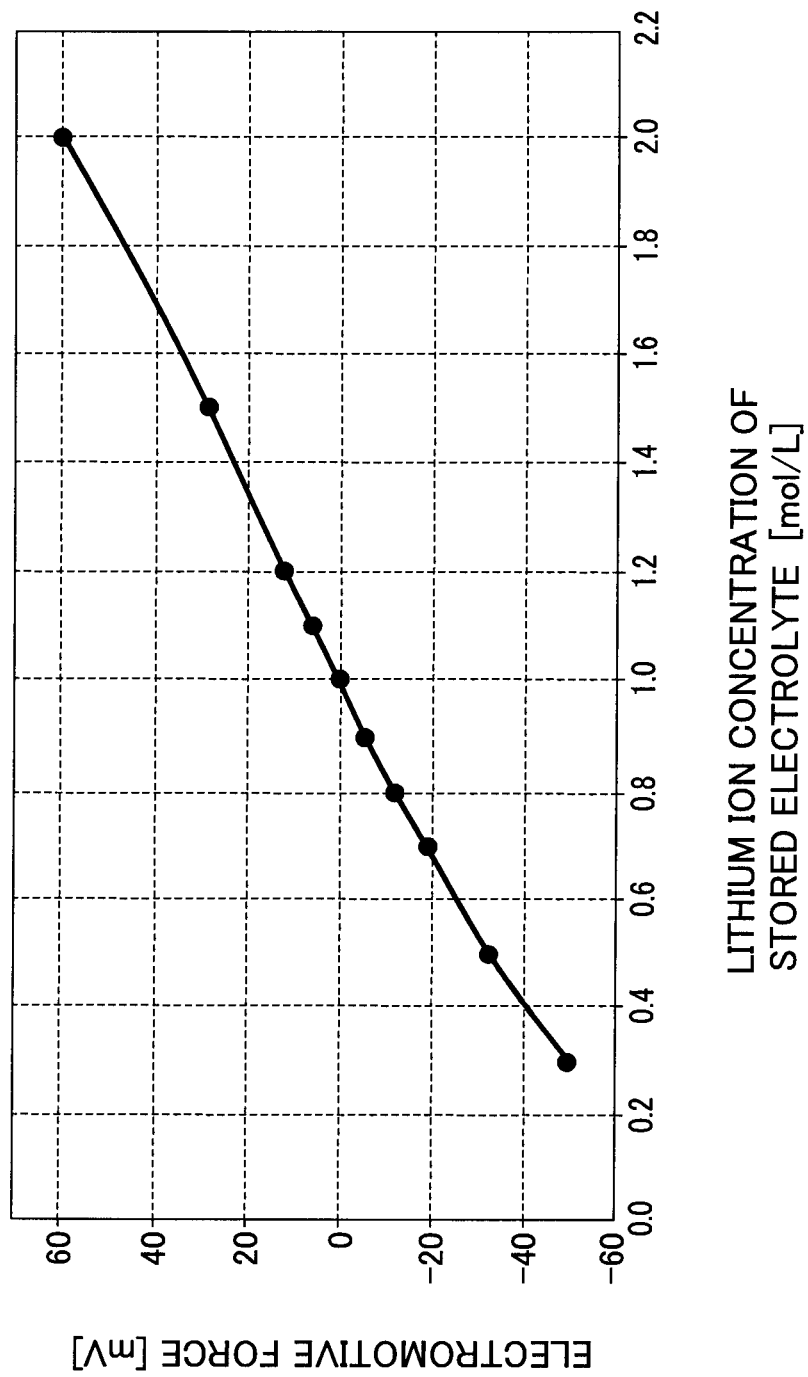
FIG. 4 is a graph showing a relationship between the lithium ion concentration in a stored electrolyte and electromotive force of the battery in the first embodiment.

The above results are shown in FIG. 4. FIG. 4 is a graph showing a relationship between the lithium ion concentration of the stored electrolyte in each battery and the electromotive force generated between the first electrode main part 41 and the second electrode main part 51. As is clear from this graph, the lithium ion concentration of the stored electrolyte 30S has a correlation with the electromotive force between the electrode main parts 41 and 51.

The battery 1 in the first embodiment 1 was subjected to a charge-discharge cycle test.

Specifically, the battery 1 was put at rest in a constant temperature bath controlled at an ambient temperature of 25° C. and was subjected to a pulse charge-discharge cycle test conducted by performing discharge at 20 C for 10 seconds and charge at 4 C for 50 seconds with 50% of a battery SOC being centered.

Furthermore, during the above charge-discharge cycle test, the internal resistance of the battery 1 and the lithium ion concentration of the stored electrolyte 30S were measured at regular intervals. Specifically, the internal resistance measurement is performed by discharging a battery with an SOC of 50% at an ambient temperature of 25° C. at a discharge rate of 20 C for 10 seconds.

The lithium ion concentration of the stored electrolyte 30S was obtained in such a manner that the first measurement electrode 40 and the second measurement electrode 50 were connected to a voltmeter to measure the electromotive force generated between the first electrode main part 41 and the second electrode main part 51, and the electromotive force was converted into a lithium ion concentration by use of the graph in FIG. 4.

Figure 5:
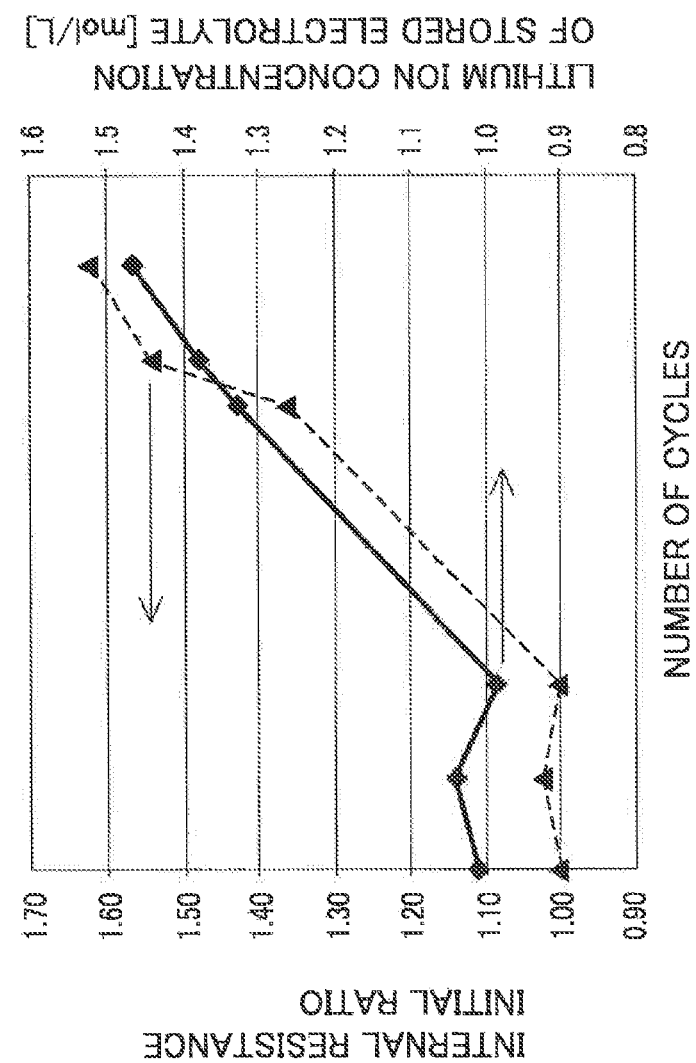
FIG. 5 is a graph showing a relationship between the number of charge-discharge cycles and an initial ratio of internal resistance of the battery in the first embodiment.

The results of the above test are shown in FIG. 5. FIG. 5 is a graph showing a relationship among the number of charge-discharge cycles conducted on the battery 1, an internal resistance initial ratio of the battery 1, the initial ratio being normalized with reference to an internal resistance value of the battery 1 at an initial stage before the charge-discharge cycle test, and a lithium ion concentration of the stored electrolyte. This graph shows that, as the number of charge-discharge cycles increases, the internal resistance initial ratio of the battery 1 increases. In other words, as the internal resistance value of the battery 1 increases, the lithium ion concentration of the stored electrolyte 30S also increases accordingly.

Reversely, this result reveals that it is possible to easily acquire whether or not the internal resistance value of the battery 1 has increased, that is, whether or not the battery 1 has deteriorated by determining the lithium ion concentration of the stored electrolyte 30S based on the magnitude of electromotive force generated between the first electrode main part 41 and the second electrode main part 51 in the battery 1. Specifically, the deterioration of the battery 1 can be detected as below.

In the method for detecting the deterioration of the battery 1 in the first embodiment, at a step of measuring the stored electrolyte, the first measurement electrode 40 and the second measurement electrode 50 are connected to the voltmeter to measure the electromotive force generated between the first electrode main part 41 and the second electrode main part 51.

From this electromotive force, subsequently, the lithium ion concentration of the stored electrolyte 30S is calculated based on the correlation (see FIG. 4) between the lithium ion concentration in the above stored electrolyte 30S and the electromotive force.

The calculated lithium ion concentration of the stored electrolyte 30S has a correlation with the internal resistance initial ratio of the battery 1 as mentioned above (see FIG. 5). It is therefore possible from a change in lithium ion concentration from the initial stage to find a change in internal resistance value of the battery 1 from the initial stage at each time point.

Thus, the degree of deterioration of the battery 1 can be easily ascertained from this magnitude of electromotive force.

First Modified Embodiment

A battery in a first modified embodiment of the present invention will be explained referring to FIG. 6.

A battery 101 in the first modified embodiment is identical to that in the above first embodiment excepting that the battery 101 has a stored-electrolyte resistance measuring means M2.

Accordingly, the following explanation is made with a focus on different configurations from the first embodiment and the same or similar parts to those in the first embodiment are not explained or are simply explained. The same or similar parts provide the same operations and effects. The same or similar parts are given the same reference signs.

Figure 6:
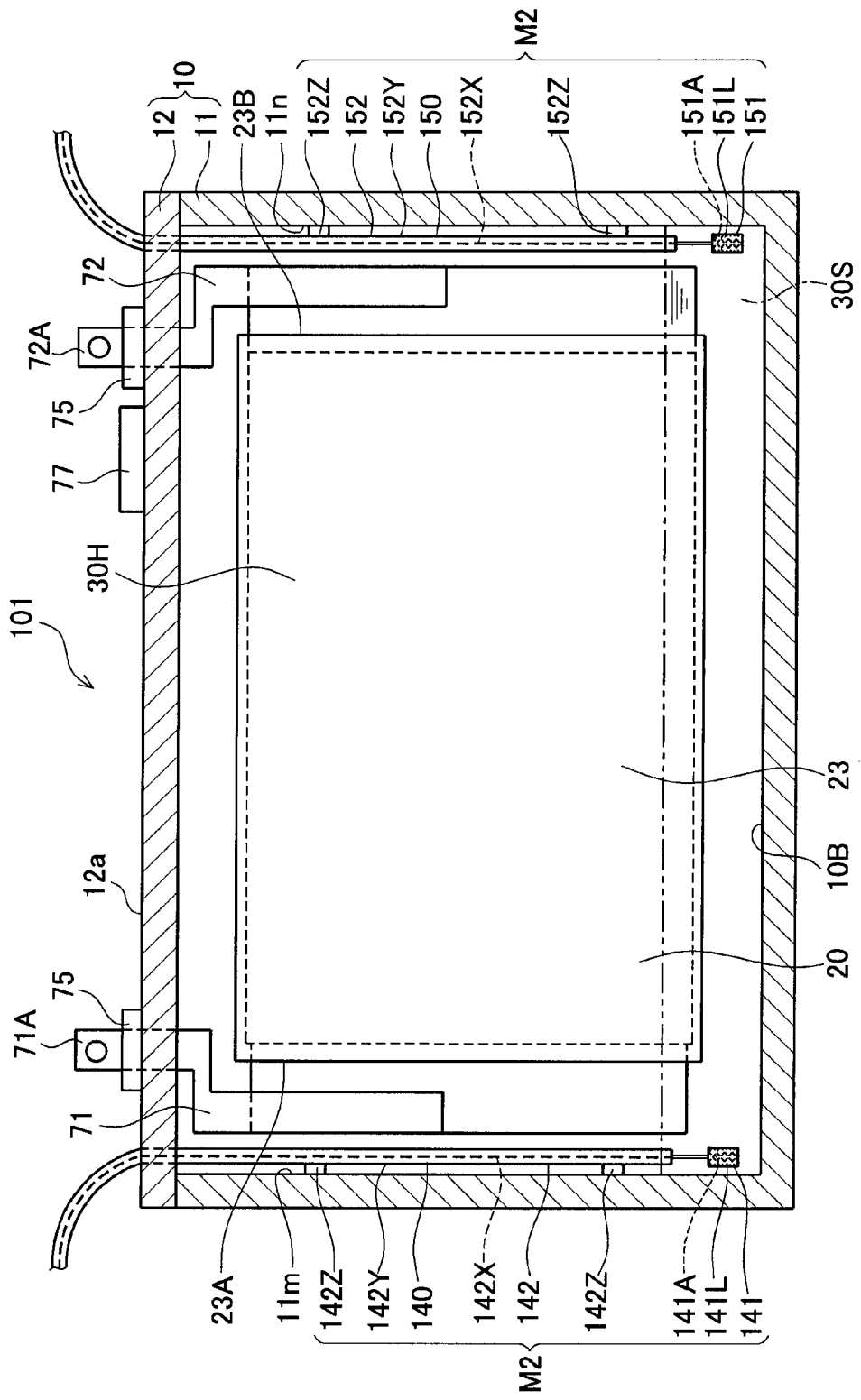
FIG. 6 is a partial cross sectional view of a battery in the first modified embodiment.

FIG. 6 is a partial cross sectional view of the battery 101 in the first modified embodiment. This battery 101 is a wound-type lithium ion secondary battery including, as with the first embodiment, the stored-electrolyte resistance measuring means M2 in addition to a rectangular box-shaped battery case 10, a power generating element 20, and an electrolyte 30.

The stored-electrolyte resistance measuring means M2 is explained below. This measuring means M2 includes a first measurement electrode 140 and a second measurement electrode 150 each being immersed in the stored electrolyte 30S.

As with the first embodiment, the first measurement electrode 140 includes a first electrode main part 141 carrying a first metal plate 141L made of lithium on both surfaces of a carrier 141A, and a first conductive wire 142. The second measurement electrode 150 includes a second electrode main part 151 carrying a second metal plate 151L made of lithium on both surfaces of a carrier 151A, and a second conductive wire 152. Furthermore, as with the first embodiment, the first conductive wire 142 is covered with a coating member 142Y made of insulation resin to surround a nickel wire 142X electrically connected to the first electrode main part 141 and the second conductive wire 152 is covered with a coating member 152Y made of insulation resin to surround a nickel wire 152X electrically connected to the second electrode main part 151.

The first electrode main part 141 of the first measurement electrode 140 and the second electrode main part 151 of the second measurement electrode 150 are immersed in the stored electrolyte 30S so that the electrode main parts 141 and 151 are apart from each other as shown in FIG. 6. The first conductive wire 142 and the second conductive wire 152 are fixed to the first side wall 11m and the second side wall 11n of the battery case body 11 through two fixing members 142Z and two fixing members 152Z, respectively. Thus, the first and second electrode main parts 141 and 151 are separately placed and prevented from contacting with the power generating element 20 to avoid the occurrence of a short circuit in the battery 101.

The first and second conductive wires 142 and 152 extend to the outside of the battery case 10 through the closing lid 12.

In this battery 101, when a voltage is supplied between the first electrode main part 141 and the second electrode main part 151, a current according to the magnitude of resistance between the electrodes is caused to flow. This resistance magnitude changes with an electric conductivity of the stored electrolyte 30S. This electric conductivity changes according to the lithium ion concentration of the stored electrolyte 30S. In other words, the magnitude of resistance caused between the first electrode main part 141 and the second electrode main part 151 has a correlation with the lithium ion concentration of the stored electrolyte 30S. In this regard, based on the resistance magnitude between the first electrode main part 141 and the second electrode main part 151 (the magnitude of current caused to flow when a constant voltage is applied between the first measurement electrode 140 and the second measurement electrode 150), the lithium ion concentration and the degree of concentration changes in the stored electrolyte 30S can be found. Thus, whether or not the battery 101 has deteriorated can be easily ascertained.

To be specific, at a step of measuring the stored electrolyte, an ammeter is connected to the first measurement electrode 140 and a predetermined voltage is applied between the ammeter and the second measurement electrode 150. The ammeter thus measures a current value flowing between the first and second measurement electrodes 140 and 150.

Then, a resistance value between the measurement electrodes 140 and 150 is calculated based on this current value and the applied voltage. Based on a correlation between the previously obtained lithium ion concentration of the stored electrolyte 30S and the resistance value, the lithium ion concentration of the stored electrolyte 30S is calculated.

The calculated lithium ion concentration in the restored electrolyte 30S has a correlation with the internal resistance initial ratio of the battery 101 as described above (see FIG. 5). Accordingly, based on a change in this lithium ion concentration, a change in internal resistance value of the battery 101 can be ascertained at each time point.

Consequently, even the method for detecting the deterioration of the battery 101 in the first modified embodiment can easily find the degree of deterioration of the battery 101 based on the resistance value (the current value).

Reference Embodiment

Next, a battery 201 in a second modified embodiment of the present invention will be explained referring to FIGS. 7 to 9.

This battery 201 is identical to that in the aforementioned first embodiment excepting that the battery 201 includes a retained-electrolyte resistance measuring means M3.

Thus, the following explanation is made with a focus on differences from the first embodiment and the same or identical parts to those in the first embodiment are not explained or are briefly explained. It is to be noted that the same or identical parts provide the same operations and effects. The same or identical parts are given the same reference signs for explanation.

Figure 7:
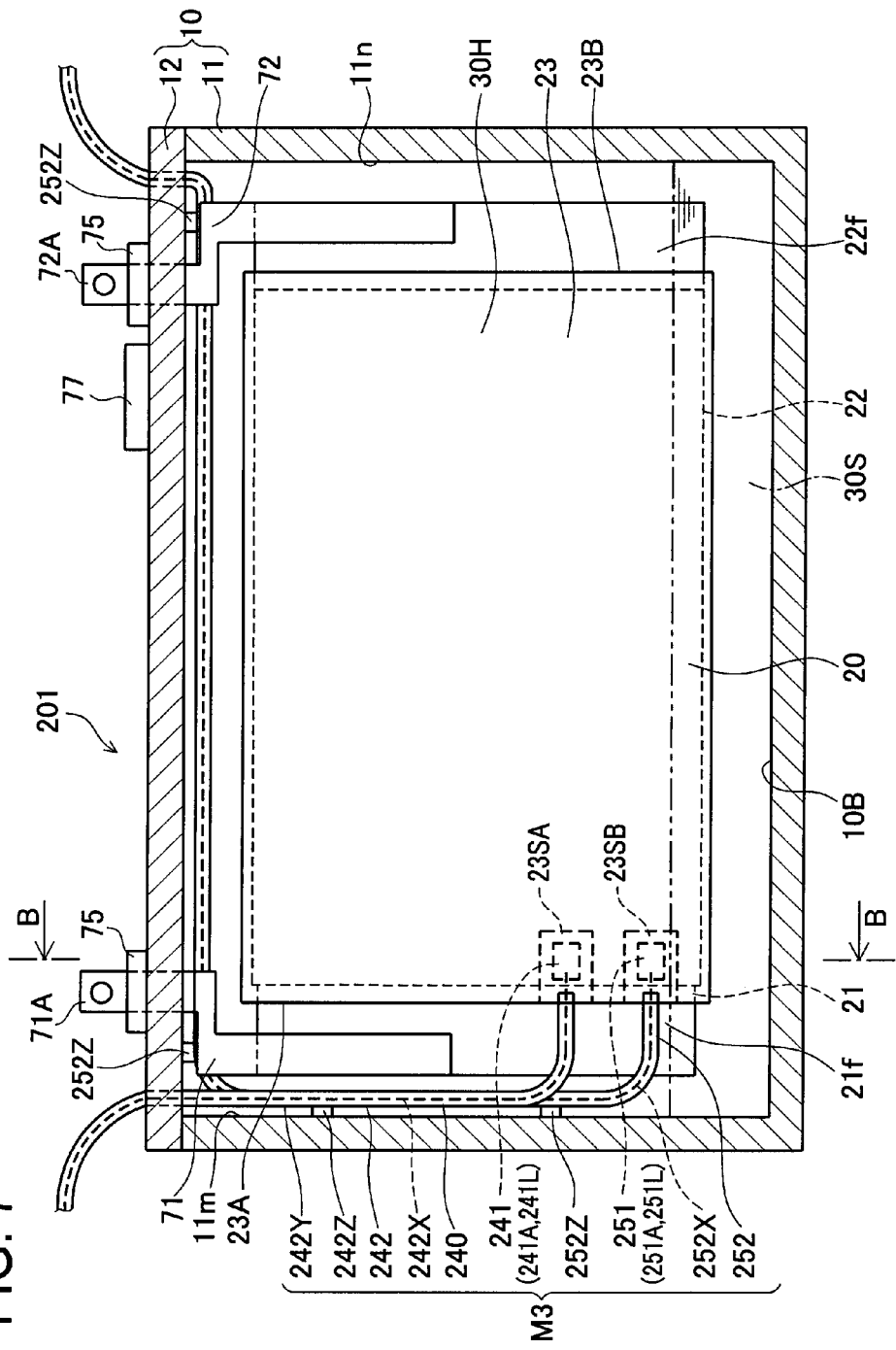
FIG. 7 is a partial cross sectional view of a battery in the reference embodiment.

FIG. 7 is a partial cross sectional view of the battery 201 in the reference embodiment, This battery 201 is a wound-type lithium ion secondary battery including, as with the first embodiment, the retained-electrolyte resistance measuring means M3 in addition to a rectangular box-shaped battery case 10, a power generating element 20, and an electrolyte 30.

The retained-electrolyte resistance measuring means M3 includes a first electrode main part 241 contacting with a retained electrolyte 30H retained between a positive electrode plate 21 and a negative electrode plate 22, and a second electrode main part 251 placed apart from the first electrode main part 241 and contacting with the retained electrolyte 30H. As with the first embodiment, the first measurement electrode 240 includes the first electrode main part 241 carrying a first metal plate 241L on both surfaces of a carrier 241A, and a first conductive wire 242, and similarly the second measurement electrode 250 includes the second electrode main part 251 carrying a second metal plate 251L on both surfaces of a carrier 251A, and a second conductive wire 252. As with the first embodiment, furthermore, the first conductive wire 242 is covered with a coating member 242Y made of insulation resin to surround a nickel wire 242X electrically connected to the electrode main part 241. The second conductive wire 252 is covered with a coating member 252Y made of insulation resin to surround a nickel wire 252X electrically connected to the electrode main part 251.

Figure 8:
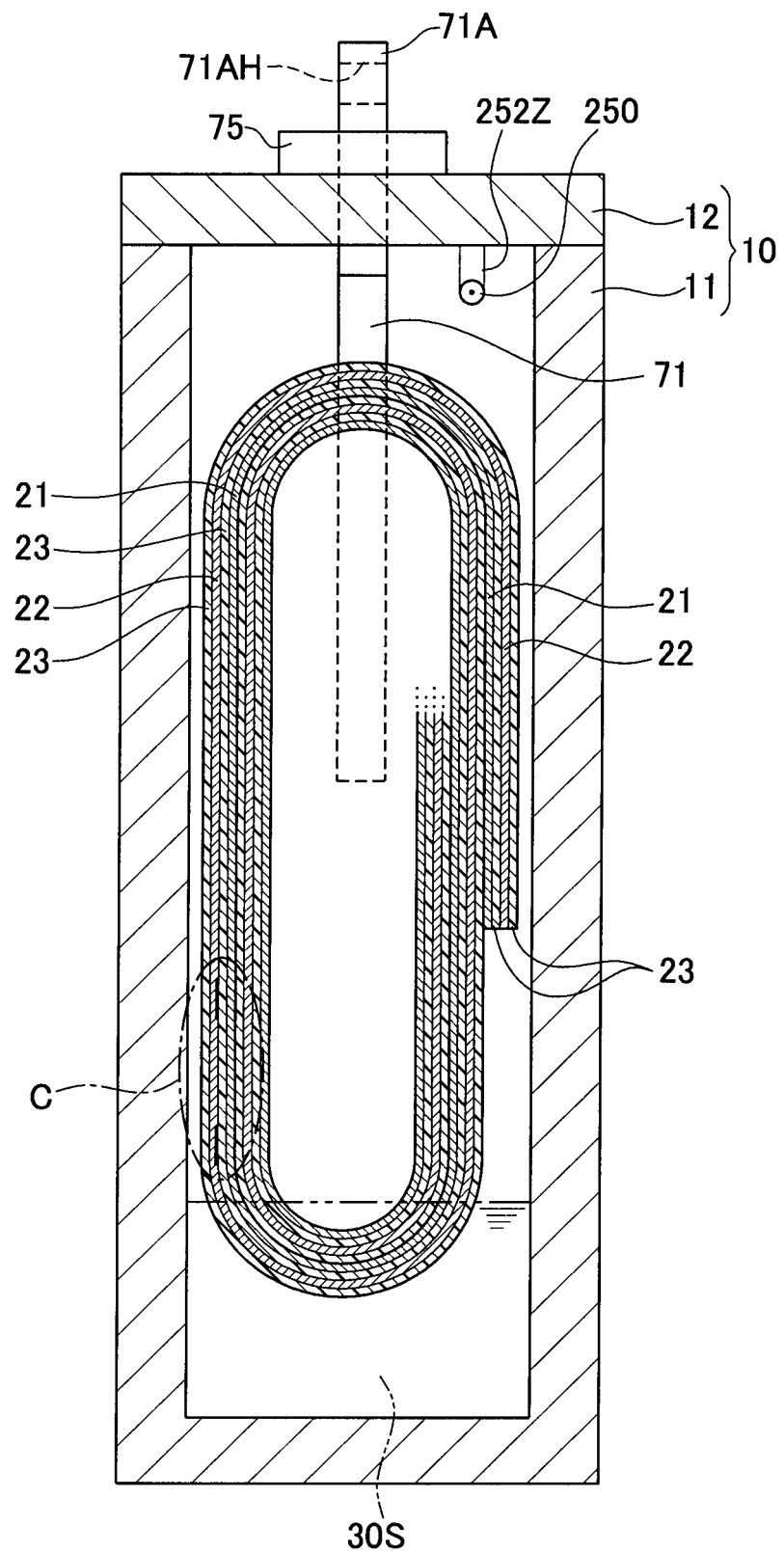
FIG. 8 is a cross sectional view (along a line B-B in FIG. 7) of the battery in the reference embodiment.
Figure 9:
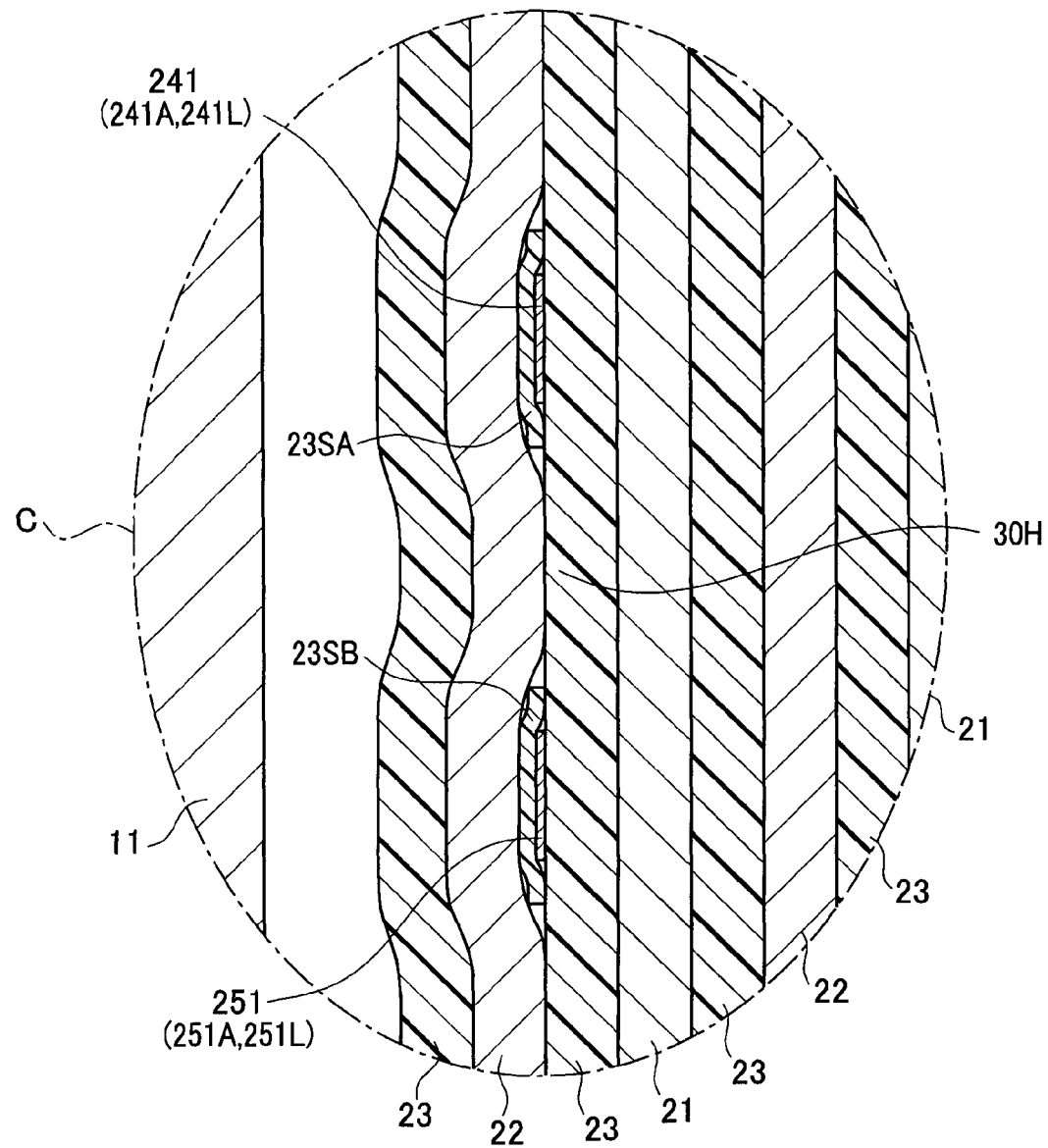
FIG. 9 is an enlarged partial cross sectional view (a part C in FIG. 8) of the battery in the reference embodiment.

The first electrode main part 241 and the second electrode main part 251 are inserted respectively toward the center side of the power generating element 20 from a first end 23A of a separator 23 interposed between the first electrode plate 21 and the negative electrode plate 22, so that the electrode main parts 241 and 251 are separately arranged on one surface of the separator 23 (see FIGS. 7, 8, and 9). The first electrode main part 241 and the second electrode main part 251 contact with the retained electrolyte 30H retained in the separator 23 (see FIGS. 8 and 9).

Between the first electrode main part 241 and the positive electrode plate 21 (or the negative electrode plate 22), a first insulation film 23SA made of polyethylene as with the separator 23 is interposed to cover the first electrode main part 241. Thus, the first electrode main part 241 is insulated from the negative electrode plate 22 (see FIGS. 8 and 9). The first conductive wire 242 extending from the power generating element 20 is fixed to a first side wall 11m of the battery case body 11 and the closing lid 12 respectively through a plurality of fixing members 242Z made of resin. Similarly, between the first electrode main part 251 and the positive electrode plate 21 (or the negative electrode plate 22), a second insulation film 23SB made of polyethylene as with the separator 23 is interposed to cover the second electrode main part 251. Thus, the second electrode main part 251 is insulated from the negative electrode plate 22 (see FIGS. 8 and 9). The second conductive wire 252 extending from the power generating element 20 is fixed to a first side wall 11m of the battery case body 11 and the closing lid 12 respectively through a plurality of fixing members 252Z made of resin.

As above, the battery 201 in the reference embodiment includes the first electrode main part 241 and the second electrode main part 251 each contacting with the retained electrolyte 30H. As with the battery 101 in the first modified embodiment, when a constant voltage is applied between the first electrode main part 241 and the second electrode main part 251, a current is caused to flow through the retained electrolyte 30H. The magnitude of resistance between the electrode main parts 241 and 251 changes according to the lithium ion concentration of the retained electrolyte 30H. That is, the battery 201 includes the retained-electrolyte resistance measuring means M3 capable of measuring a resistance value (a current value) correlated with the lithium ion concentration of the retained electrolyte 30H. Accordingly, regarding this battery 201, the lithium ion concentration of the retained electrolyte 30H can be found from the magnitude of resistance measured by the retained-electrolyte resistance measuring means M3 (the magnitude of current caused to flow when the constant voltage is applied between the first electrode main part 241 and the second electrode main part 251). The lithium ion concentration of the retained electrolyte 30H decreases as the internal resistance value of the battery 201 increases as described above. Thus, whether or not the battery 201 has deteriorated can be easily determined.

To be more concrete, at the step of measuring the retained electrolyte, the ammeter is connected to the first measurement electrode 240 and a predetermined voltage is applied between the ammeter and the second measurement electrode 250. The ammeter measures a current value flowing between the first and second measurement electrodes 240 and 250.

Based on this current value and the applied voltage, a resistance value between the measurement electrodes 240 and 250 is calculated. The lithium ion concentration of the retained electrolyte 30H is then calculated based on the correlation between the previously obtained lithium ion concentration of the retained electrolyte 30H and the resistance value.

The calculated lithium ion concentration of the retained electrolyte 30H has a correlation with the internal resistance value of the battery 201. Accordingly, based on a change in this lithium ion concentration, a change in internal resistance value of the battery 201 can be ascertained at each time point.

Consequently, even the method for detecting the deterioration of the battery 201 in the reference embodiment can easily ascertain the degree of deterioration of the battery 201 based on the magnitude of resistance value (current value).

Second Modified Embodiment

In the above first embodiment, the first modified embodiment, and the reference embodiment, the first measurement electrode and the second measurement electrode provided separately from the electrode (a positive electrode and a negative electrode) of the power generating element are used to measure electromotive force in the stored electrolyte and a current value when a predetermined voltage is applied, or, a current value when a predetermined voltage is applied in the retained electrolyte.

On the other hand, the above configurations may be arranged such that the first measurement electrode is removed and the positive electrode plate or the negative electrode plate of the power generating element is utilized as the first electrode main part of the first measurement electrode.

A battery in such configuration may utilize any of a positive electrode plate and a negative electrode plate. Which battery is more preferable is studied as below.

In the positive electrode plate and the negative electrode plate, a positive potential of the positive electrode plate or a negative potential of the negative electrode plate is liable to change according to the quantity of lithium (lithium ions) existing in an active material carried on the positive or negative electrode plate. Accordingly, when a state of charge of a battery is changed, the positive potential of the positive electrode plate and the negative potential of the negative electrode plate change respectively.

Figure 10:
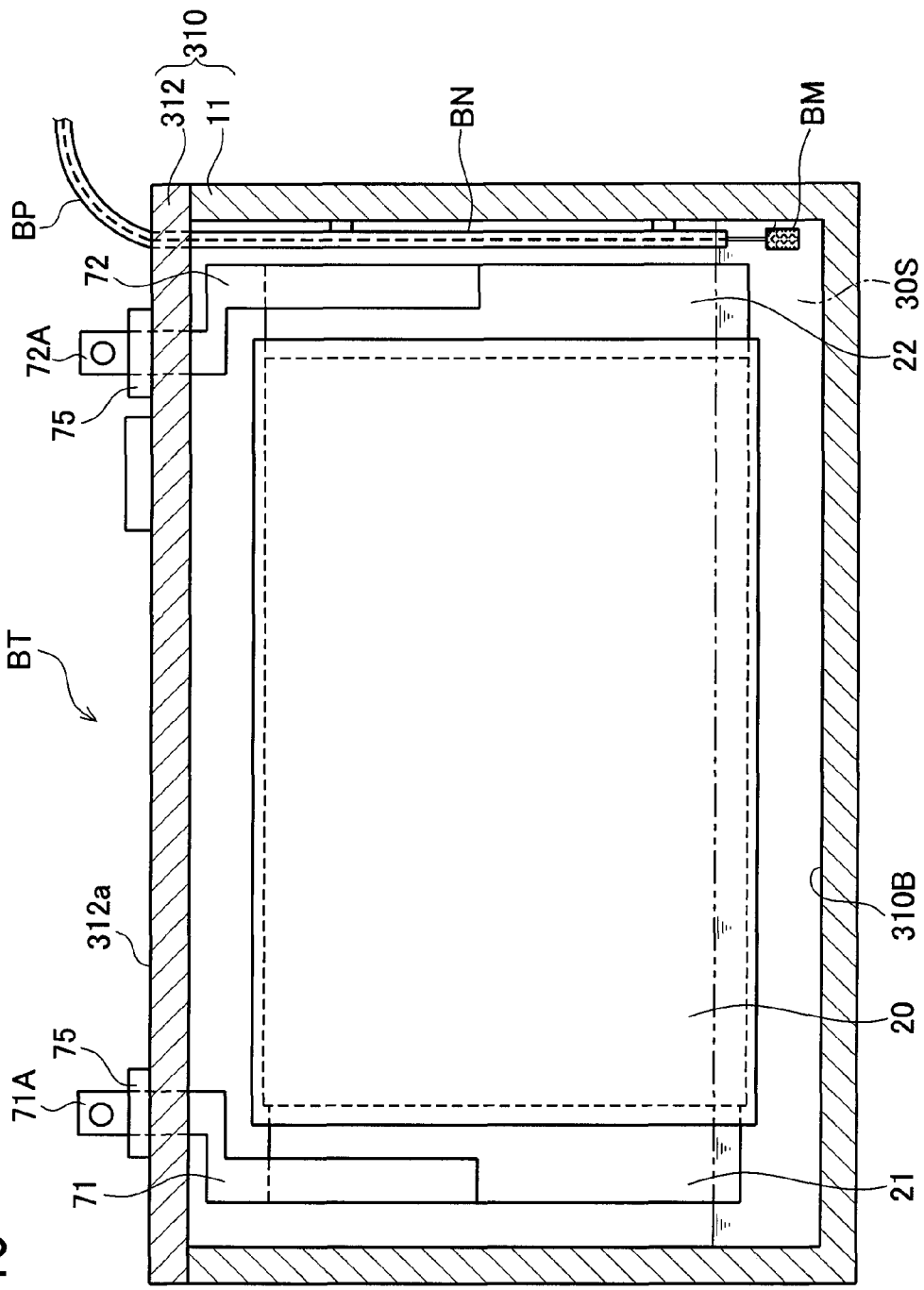
FIG. 10 is a partial cross sectional view of a lithium ion secondary battery.

To confirm this condition, a battery BT shown in FIG. 10 is prepared and a state of charge of this battery Bt is changed. At that time, changes in a positive potential VP of the positive electrode plate 21 and a negative potential VN of the negative electrode plate 22 are measured respectively.

This battery BT includes, as with the first embodiment, a power generating element 20, a positive current collector 71, a negative current collector 72, and a stored electrolyte 30S. In addition, the battery BT includes an electrode BN that carries a metal plate BM made of metal lithium at an end and is immersed in the stored electrolyte 30S, and a battery case 310 housing them (see FIG. 10).

The battery case 310 includes a battery case body 11 and a closing lid 312 both being made of stainless steel. In the closing lid 312, a positive terminal part 71A of the positive current collector 71, a negative terminal part 72A of the negative current collector 72a, and a second conductive wire BP of the electrode BN are inserted to protrude from an upper surface 312a.

The power generating element 20 includes the positive electrode plate 21 and the negative electrode plate 22 as with the first embodiment (see FIG. 10). The positive electrode plate 21 made of a strip-shaped aluminum foil carries a positive active material layer not shown on both surfaces so that the positive lead part 21f extending along one side is exposed. This positive active material layer contains lithium nickel oxide ($LiNiO_2$) as the positive active material, acetylene black as a conductive agent, and polytetrafluoroethylene (PTFE) and carboxymethyl cellulose (CMC) as a binding agent.

The negative electrode plate 22 made of a strip-shaped copper foil carries a negative active material layer not shown on both surfaces so that the negative lead part 22f extending along one side is exposed. This negative active material layer contains graphite and a binding agent.

After this battery BT is fully charged, a constant current discharge is performed with a discharge current of 1 C until the battery voltage of the battery BT is decreased to 2.5 V. At that time, a voltmeter is connected between the battery BN and the positive terminal part 71A of the positive current collector 71 and the positive potential VP of the positive electrode plate 21 connected to the positive current collector 71 is measured. Another voltmeter is connected between the battery BN and the negative terminal part 72A of the negative current collector 72 and the negative potential VN of the negative electrode plate 22 is measured.

Figure 11:
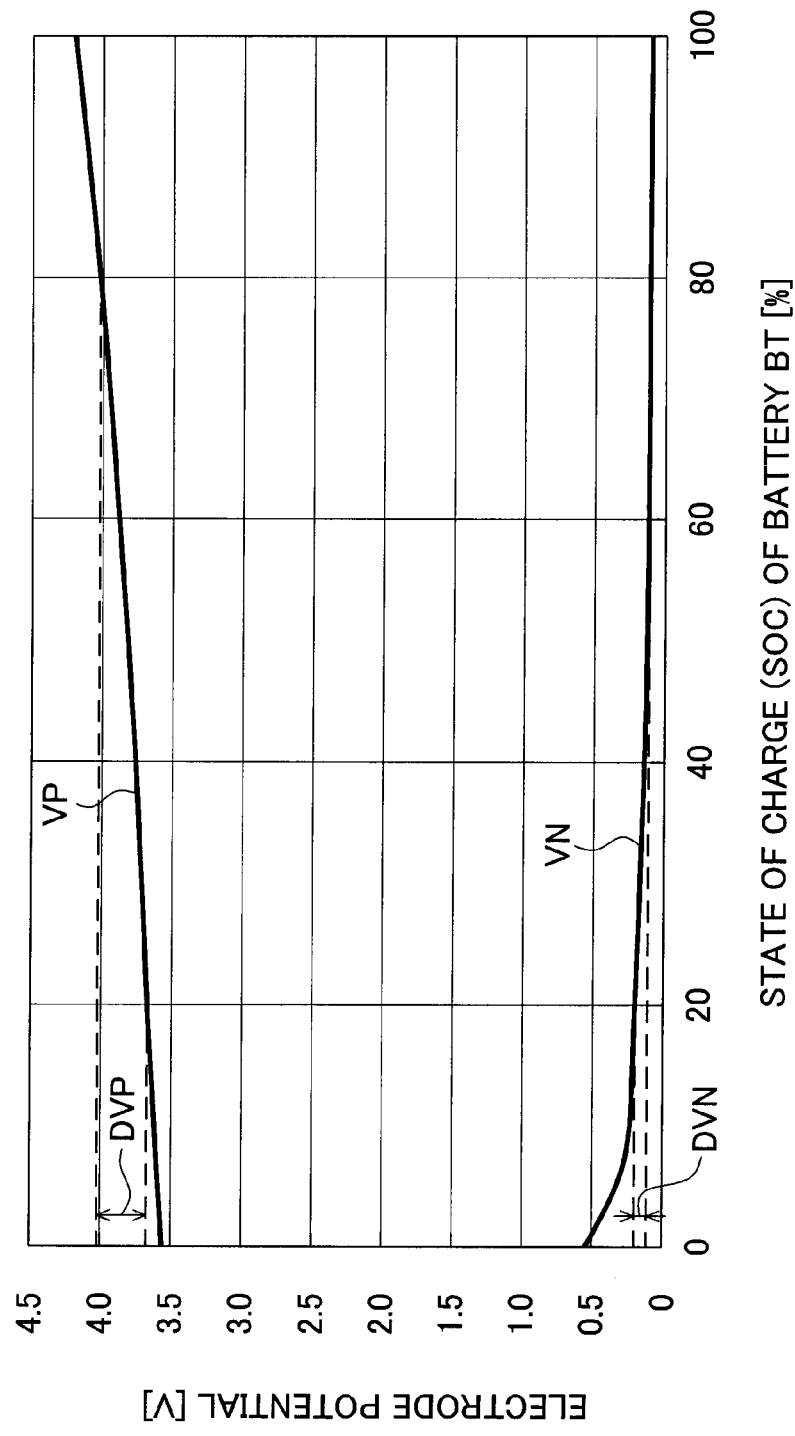
FIG. 11 is an explanatory view of the lithium ion secondary battery.

Accordingly, a relationship between the state of charge (SOC) of the battery BT and the potential VP of the positive electrode plate and the negative potential VN of the negative electrode plate 22 is plotted in a graph (see FIG. 11).

As is found from this FIG. 11, when the state of charge (SOC) of the battery BT is changed from SOC 100% to SOC 0%, the positive potential VP of the positive electrode plate 21 is gradually decreased. On the other hand, the negative potential VN of the negative electrode plate 22 is increased gradually but not so clearly as the positive potential VP.

Herein, the state of charge of the battery BT is changed in a predetermined range and the degree of change in the potentials VP and VN occurring in the positive electrode plate 21 and the negative electrode plate 22 (hereinafter, referred to as a positive potential range DVP and a negative potential range DVN) is measured. It is found that when the state of charge is changed in a range of SOC 20% to 80%, the positive potential range DVP is 0.35V and the negative potential range DVN is 0.09V.

Consequently, the following is found. When the battery state of charge is changed in a predetermined range (SOC 20% to 80%), even if the concentration of the stored electrolyte 30S is equal, the positive potential VP of the positive electrode plate 21 is changed in the positive potential range DVP and the negative potential VN of the negative electrode plate 22 is changed in the negative potential range DVN. Therefore, when the electromotive force between an electrode plate having a wide potential range (the positive electrode plate 21 in this example) and the second measurement electrode 50 in the first embodiment is measured, if a state of charge during the electromotive force measurement is different, the potential of the relevant electrode plate (the positive electrode plate 21) largely differs even at the same concentration of the stored electrolyte 30S. It is therefore impossible to accurately measure the electromotive force generated between the relevant electrode plate (the positive electrode plate 21) and the second electrode main part 51 of the second measurement electrode 50 according to the concentration of the stored electrolyte 30S.

The same also applies to the aforementioned first modified embodiment and reference embodiment. Specifically, in the first modified embodiment, it is impossible to precisely measure the magnitude of resistance caused between the relevant electrode plate (the positive electrode plate 21) and the second electrode main part 151 of the second measurement electrode 150 according to the concentration of the stored electrolyte 30S (the magnitude of current caused to flow when a constant voltage is applied between the relevant electrode plate and the second electrode main part 151). In the reference embodiment, it is also impossible to precisely measure the magnitude of resistance caused between the relevant electrode plate (the positive electrode plate 21) and the second electrode main part 251 of the second measurement electrode 250 according to the concentration of the retained electrolyte 30H (the magnitude of current caused to flow when a constant voltage is applied between the relevant electrode plate and the second main part 251).

In the second modified embodiment, the negative potential range DVN is narrower than the positive potential range DVP. Accordingly, the negative electrode plate 22 which is a narrow potential range electrode plate having a narrow potential range is used as an electrode plate also serving as the first electrode main part in the stored-electrolyte physical quantity measuring means (a concentration-difference electromotive-force measuring means M4 mentioned later in the second modified embodiment) and the negative current collector 72 connected to the negative electrode plate 22 is used as a current collector also serving as the first conductive part.

Considering the above configurations, a battery 301 in the second modified embodiment will be explained referring to FIGS. 12 to 14.

The battery 301 of the second modified embodiment is identical to that in the first embodiment excepting that the battery 301 includes the concentration-difference electromotive-force measuring means M4 including the aforementioned negative electrode plate 22 and negative current collector 72 instead of the first measurement electrode 40 in the first embodiment, and that the battery 301 includes a sponge as a liquid retaining member for absorbing (retaining) a stored electrolyte, the sponge being placed in a lower part in a battery case.

Thus, the following explanation is made with a focus on differences from the first embodiment and the same or identical parts to those in the first embodiment are not explained or are briefly explained. It is to be noted that the same or identical parts provide the same operations and effects. The same or identical parts are given the same reference signs for explanation.

Figure 12:
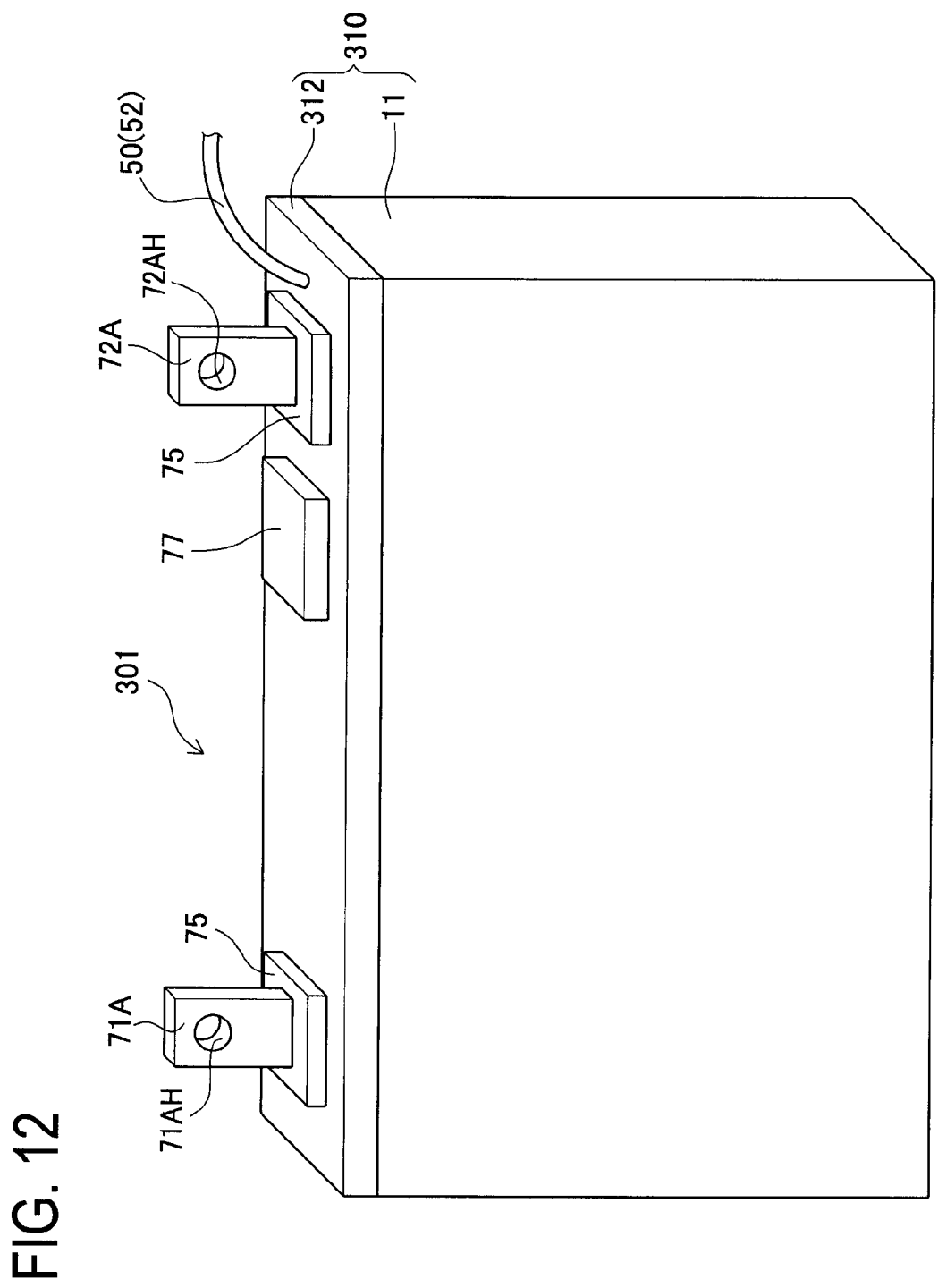
FIG. 12 is a perspective view of a battery in a second modified embodiment.
Figure 13:
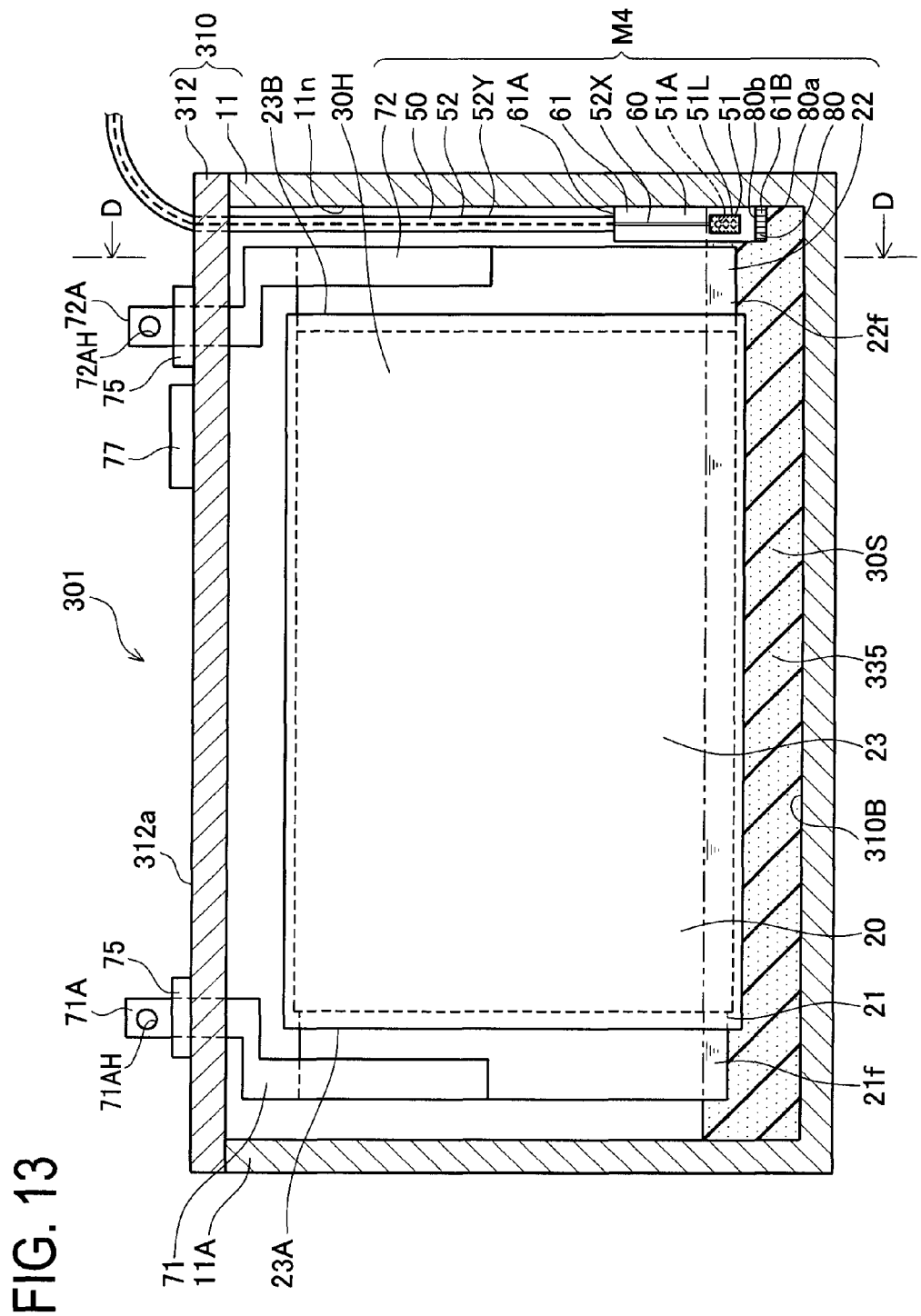
FIG. 13 is a partial cross sectional view of the battery in the second modified embodiment.
Figure 14:
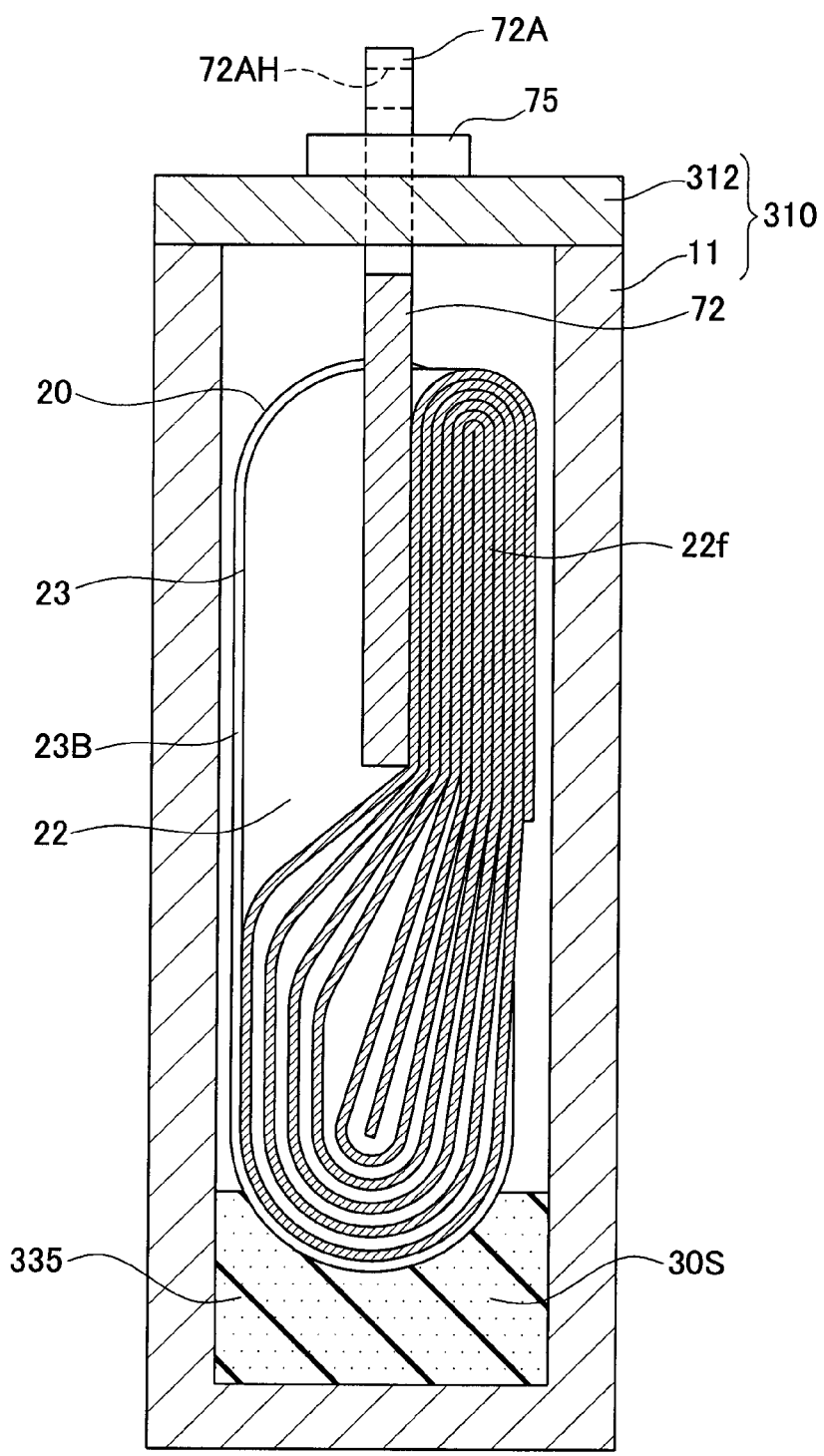
FIG. 14 is a cross sectional view (along a line D-D in FIG. 13) of the battery in the second modified embodiment.

The battery case 310 of the battery 301 includes a battery case body 11 identical to that in the first embodiment and a rectangular plate-shaped closing lid 312 (see FIGS. 12 and 13). In the closing lid 312, a positive terminal part 71A of a positive current collector 71, a negative terminal part 72A of a negative current collector 72, and a second conductive wire 52 of a second measurement electrode 50 are inserted to protrude from an upper surface 312a.

This battery case 310 internally houses a power generating element 20 having a positive electrode plate 21 and a negative electrode plate 22 identical to those in the first embodiment.

The positive electrode plate 21 and the negative electrode plate 22 are respectively connected to the positive current collector 71 and the negative current collector 72 identical to those in the first embodiment (see FIG. 13). This positive current collector 71 is connected to the positive electrode plate 21 and the positive terminal part 71A of the positive current collector 71 is exposed to the outside of the battery case 310 (the lid 312), that is, protrudes from the upper surface 312a of the lid 312 (see FIG. 13). The negative current collector 72 is, as with the positive current collector 71, placed so that the negative terminal part 72A is exposed to the outside of the battery case 310 (the lid 312) (see FIGS. 12 and 13).

The battery case 310 contains the electrolyte 30 identical to that in the first embodiment. However, the battery 301 in the second modified embodiment is different from that in the first embodiment in that the stored electrolyte 30S is absorbed in a sponge 335 and this sponge 335 is placed in a lower part of the battery case 310.

Specifically, the sponge 335 absorbing and retaining the stored electrolyte 30S is placed on a lower surface 310B in the battery case 310 so that the sponge 335 is in contact with the positive electrode plate 21 and the negative electrode plate 22 of the power generating element 20 and a filter 80 of the concentration-difference electromotive-force measuring means M4 mentioned later as shown in FIG. 13. The stored electrolyte 30S and the retained electrolyte 30H retained in the power generating element 20 are allowed to communicate with each other as with the first embodiment (see FIGS. 13 and 14). In addition, the concentration-difference electromotive-force measuring means M4 mentioned later can measure a potential difference between the stored electrolyte 30S and the reference electrolyte 60, that is, the electromotive force generated between the negative electrode plate 22 and the second electrode main part 51. Even when the battery 301 is located at a slant, the sponge 335 is absorbing and retaining the stored electrolyte 30S. Accordingly, the positive electrode plate 21 and the negative electrode plate 22 of the power generating element 20 and the filter 80 can contact with the stored electrolyte 30S.

The concentration-difference electromotive-force measuring means M4 is explained below. This measuring means M4 is different from that in the first embodiment in that the measuring means M4 utilizes the negative electrode plate 22 of the power generating element 20 and the negative current collector 72 connected to this negative electrode plate 22 instead of the first measurement electrode 40 used in the concentration-difference electromotive-force measuring means M1 in the first embodiment. Specifically, the concentration-difference electromotive-force measuring means M4 includes a reference electrolyte 60, a cylindrical container 61, a second measurement electrode 50, the filter 80, the negative electrode plate 22 also serving as the first electrode main part of the first measurement electrode, and the negative current collector 72 also serving as the first conductive part of the first measurement electrode (see FIG. 13). The negative electrode plate 22 is a contact electrode plate a part of which contacts with the stored electrolyte 30S to serve as the first electrode main part as shown in FIGS. 13 and 14.

Regarding the battery 301, as with the first embodiment described above, the lithium ion concentration of the stored electrolyte 30S can be ascertained based on the magnitude of electromotive force generated between the negative electrode plate 22 and the second electrode main part 51. This makes it possible to easily ascertain whether or not the internal resistance value of the battery 301 has increased, that is, the battery 301 has deteriorated. To be concrete, the deterioration of the battery 1 can be detected in the following manner.

In the battery 301 in the second modified embodiment, the negative current collector 72 and the second measurement electrode 50 are connected to the voltmeter at the step of measuring the stored electrolyte, and the electromotive force generated between the negative electrode plate 22 and the second electrode main part 51 is measured.

Based on this electromotive force, thereafter, as with the first embodiment, the lithium ion concentration of the stored electrolyte 30S is calculated based on a correlation between the lithium ion concentration in the aforementioned stored electrolyte 30S and the electromotive force (see FIG. 4).

The calculated lithium ion concentration of the stored electrolyte 30S has the correlation with the internal resistance initial ratio in the battery 1 as mentioned above (see FIG. 5). Accordingly, based on a change in lithium ion concentration, a change in internal resistance value of the battery 301 at each time point can be ascertained.

Accordingly, based on the magnitude of electromotive force generated between the negative electrode plate 22 and the second electrode main part 51, the level of deterioration of the battery 301 can be easily detected.

The battery 301 in the second modified embodiment includes the sponge 335 as above. Even when this battery 301 is placed at a slant, the lithium ion concentration of the stored electrolyte 30S can be measured appropriately by use of the concentration-difference electromotive-force measuring means M4.

Hence, deterioration of the battery 301 can be detected by use of this concentration-difference electromotive-force measuring means M4.

The negative electrode plate 22 is a contact electrode plate also serving as the first electrode main part and contacting with the stored electrolyte 30S. The negative current collector 72 also serves as the first conductive part. Thus, there is no need to provide the first electrode main part separately from the negative electrode plate 22 and also the first conductive part separately from the negative current collector 72, so that the battery 301 can have a simple configuration.

Furthermore, the simple configuration can detect the deterioration of this battery 301.

The negative electrode plate 22 which is the aforementioned narrow potential range electrode plate is used as the contact electrode plate. In addition, this negative electrode plate 22 is also used as the first electrode main part. Accordingly, the potential change in the negative electrode plate 22 remains small even when the state of charge of the battery 301 varies during measurement. The use of this negative electrode plate 22 therefore enables precise measurement of the electromotive force generated between the negative electrode plate 22 and the second measurement electrode 50 (the second electrode main part 51).

Using such negative electrode plate 22 and second measurement electrode 50 (the second electrode main part 51), consequently, the deterioration of the battery 301 can be detected more appropriately.

In the above second modified embodiment, the positive electrode plate 21 and the negative electrode plate 22 are compared and the negative electrode plate 22 which is the small potential range electrode plate is used instead of the first electrode main part of the first measurement electrode. However, even when the positive electrode plate 21 is used instead of the negative electrode plate 22, the electromotive force between the positive electrode plate 21 and the second measurement electrode 50 can be measured. Different from the second modified embodiment, if the positive potential range DVP and the negative potential range DVN are compared and the positive potential range DVP is narrower than the negative potential range DVN, such positive electrode plate is used as the narrow potential range electrode plate instead of the first electrode main part. In other words, it is preferable to measure the electromotive force between the positive electrode plate 21 and the second electrode main part 51 of the second measurement electrode 50.

Second Embodiment

Figure 15:
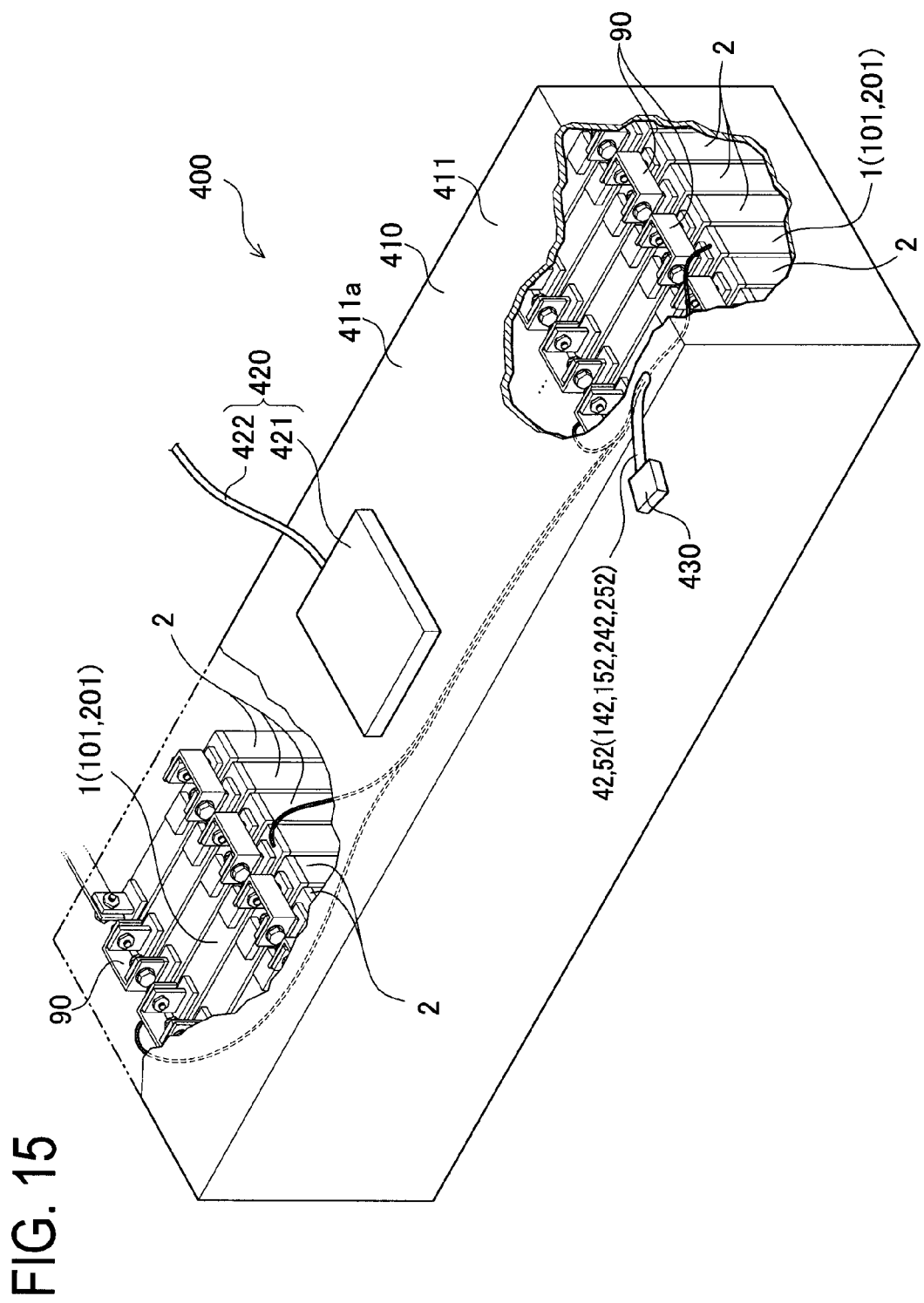
FIG. 15 is a partial sectional view of an assembled battery in the second embodiment.

An assembled battery 400 in a second embodiment shown in FIG. 15 contains a plurality of lithium ion secondary batteries 2 (hereinafter, also simply referred to as "batteries 2") having no function of measuring the concentration of the electrolyte 30 and further the battery 1 shown in the above first embodiment (alternatively, the battery 101, 301 in the first modified embodiment or second modified embodiment,). This assembled battery 400 includes a battery part 410 housing the batteries 1 (101, 301) and 2 in an assembled battery case 411 and a battery monitoring unit 420 placed on an upper surface 411a of the case 411 to monitor each state (battery temperature and voltage) of the batteries 1 (101, 301) and 2 in the battery part 410. In the battery part 410, the plurality of batteries 1 (101, 301) and 2 are fastened to bus bars 90 with bolts through holes 71AH and 72AH (see FIGS. 1 and 12) of terminal parts 71A and 72A of the batteries 1 (101, 301) and 2, so that the batteries 1 (101, 301) and 2 are connected in series with each other.

The battery monitoring unit 420 has a rectangular box-shaped main case 421 in which a circuit not shown is provided and a communication cable 422 for transmitting and receiving data obtained by the battery monitoring unit 420 to and from an external device, for example.

The first conductive wire 42 (142) of the first measurement electrode 40 (140) and the second conductive wire 52 (152) of the second measurement electrode 50 (150) of the battery 1 (101) extend to the outside of the case 411. At their ends, a resin connector 430 is provided. Inside this connector 430, terminals (not shown) of the first conductive wire (142) and the second conductive wire 52 (152) are separately exposed so as to be electrically connectable with a conductive wire (or a connector) extending from for example an external measuring device. In the case of the battery 301, which is not illustrated in the figure, only the second conductive wire 52 of the second measurement electrode 50 extends to the outside of the case 411.

In the assembled battery 400 in the second embodiment as above, a part of the batteries constituting the assembled battery 400 is the battery 1 (101, 301) having a function of measuring the lithium ion concentration of the electrolyte 30. Accordingly, the electromotive force or the resistance value (the current value) between the first measurement electrode 40 (140) and the second measurement electrode 50 (150) in the battery 1 (101, 301) is acquired. This makes it possible to easily estimate the degree of deterioration of the battery 1 (101, 301) and hence the degree of deterioration of each battery 2 used in the assembled battery 400.

Third Modified Embodiment

An assembled battery 400X in a fourth modified embodiment of the present invention will be explained referring to FIGS. 16 to 19.

This assembled battery 400X is identical to that in the second embodiment in that the assembled battery 400X includes one battery 1 (101, 301) and a plurality of the batteries 2. However, this assembled battery 400X is different from the assembled battery 400 in the second embodiment in that the battery 1 (101, 301) is used as a minimum-temperature battery whose temperature becomes minimum due to arrangement of the batteries when charged and discharged.

Figure 16:
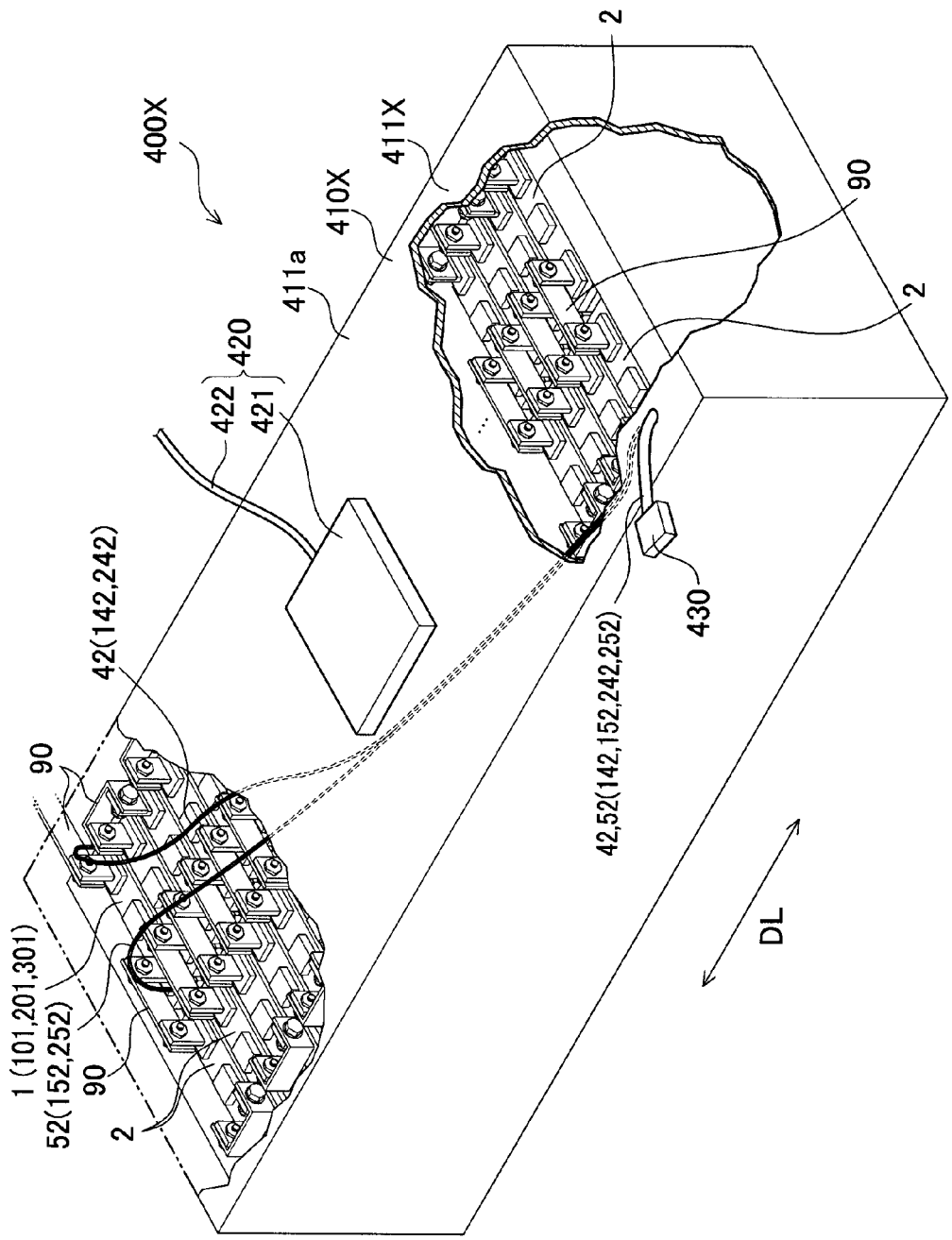
FIG. 16 is a partial sectional view of an assembled battery in a third modified embodiment.
Figure 17:
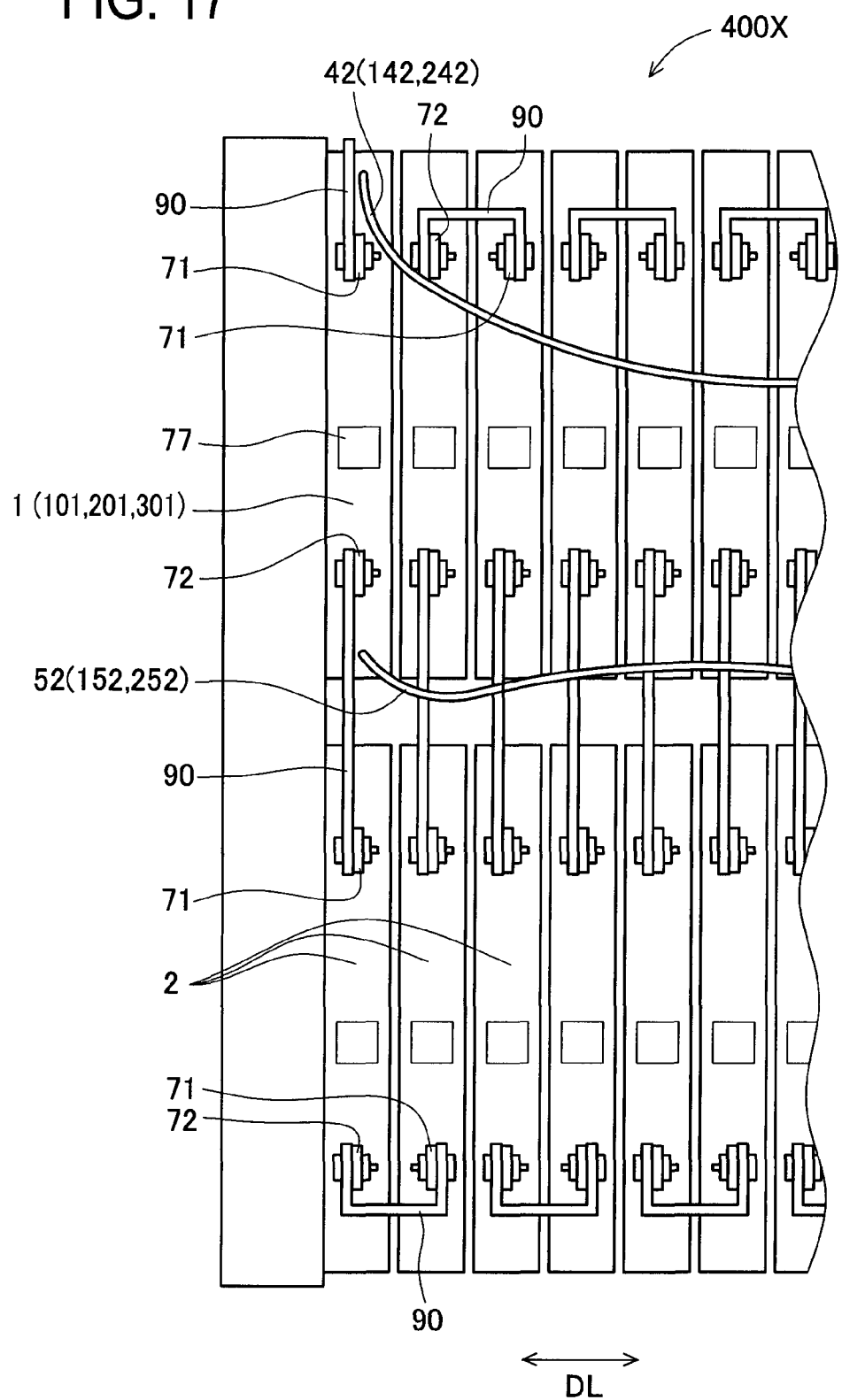
FIG. 17 is an explanatory view of the assembled battery in the third modified embodiment.

This assembled battery 400X includes a battery part 410X containing one battery 1 (101, 301) and a plurality of the batteries 2 in an assembled battery case 411X and a battery monitoring unit 420 identical to that in the second embodiment, placed on an upper surface 411a of the case 411X. In the battery part 410X, as shown in FIGS. 16 and 17, the battery 1 (101, 301) and the batteries 2 are arranged in two rows in a longitudinal direction DL (in a direction from an upper left side to a lower right side in FIG. 16 and in a right-left direction in FIG. 17) and are connected in series to each other by use of a plurality of bus bars 90.

Meanwhile, it has been found that when lithium ion secondary batteries are charged and discharged with a relatively high current (at a high rate current), the degree of deterioration is different from battery to battery under the condition that environmental temperatures of the lithium ion secondary batteries are different.

Therefore, a plurality of lithium ion secondary batteries placed at different environmental temperatures were prepared and subjected to the charge-discharge cycle test in order to study a relationship between the environmental temperature and the internal resistance initial ratio in the battery.

Figure 18:
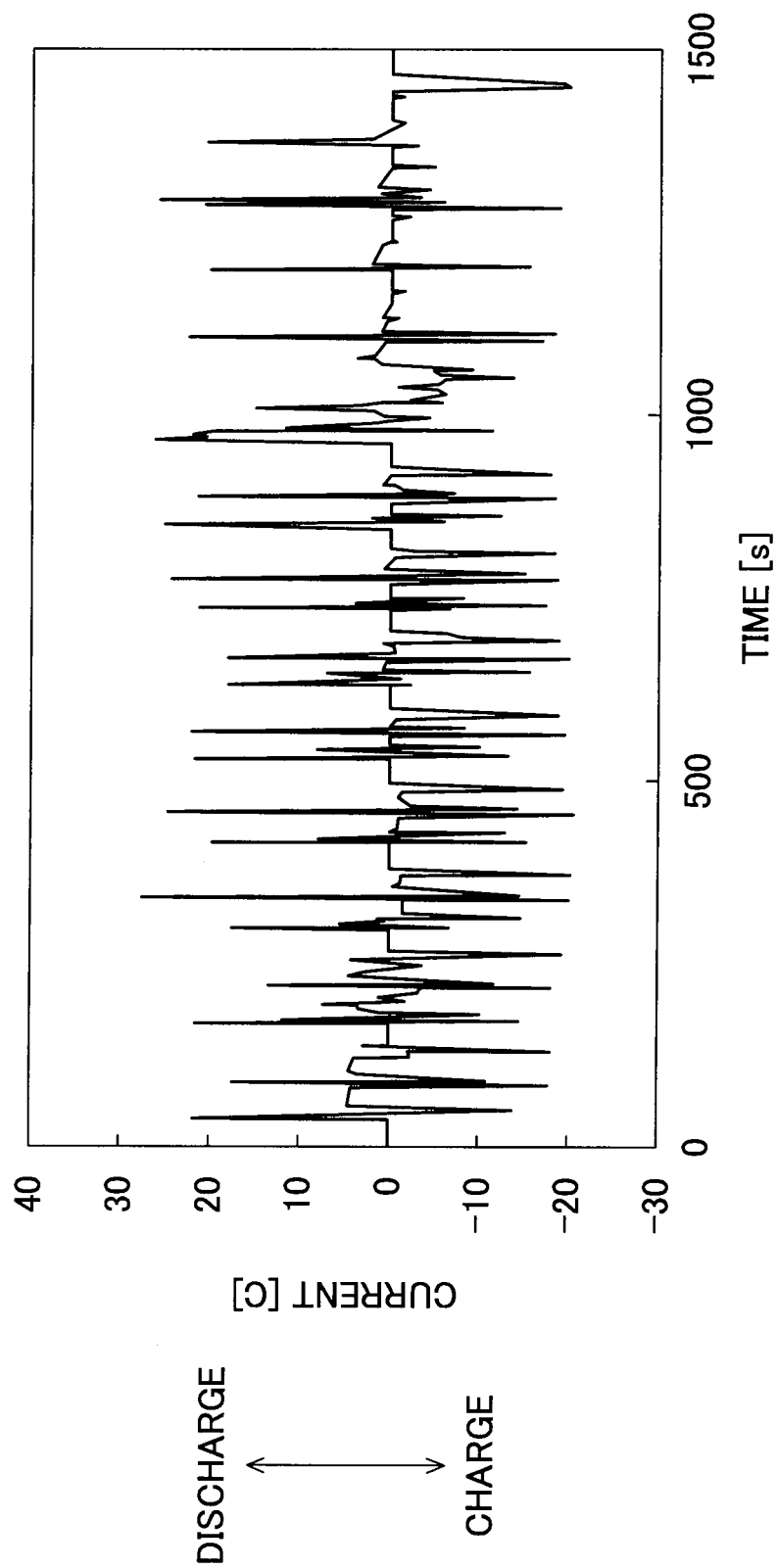
FIG. 18 is a charge-discharge pattern used in a charge-discharge cycle test.

Specifically, the lithium ion secondary batteries A, B, and C (hereinafter, also referred to as batteries A, B, and C) were prepared and put at rest in different constant-temperature baths (not shown) whose room temperatures were set at 25° C., 40° C., and 60° C. respectively. A power source (not shown) was placed outside each constant-temperature bath and connected to a positive terminal part and a negative terminal part (not shown) of the battery A, B, or C in each constant-temperature bath. By use of the power sources, the battery A, B, and C were subjected to the charge-discharge cycle test. To be specific, the power sources were controlled to repeat more than once a charge-discharge pattern of continuous 1500 seconds as shown in FIG. 18. Regarding a vertical axis in this current pattern, a positive side represents a discharge current and a negative side represents a charge current. This charge-discharge pattern is achieved by alternately repeating pulse discharge of maximum about 30 C and pulse charge of maximum 20 C.

Figure 19:
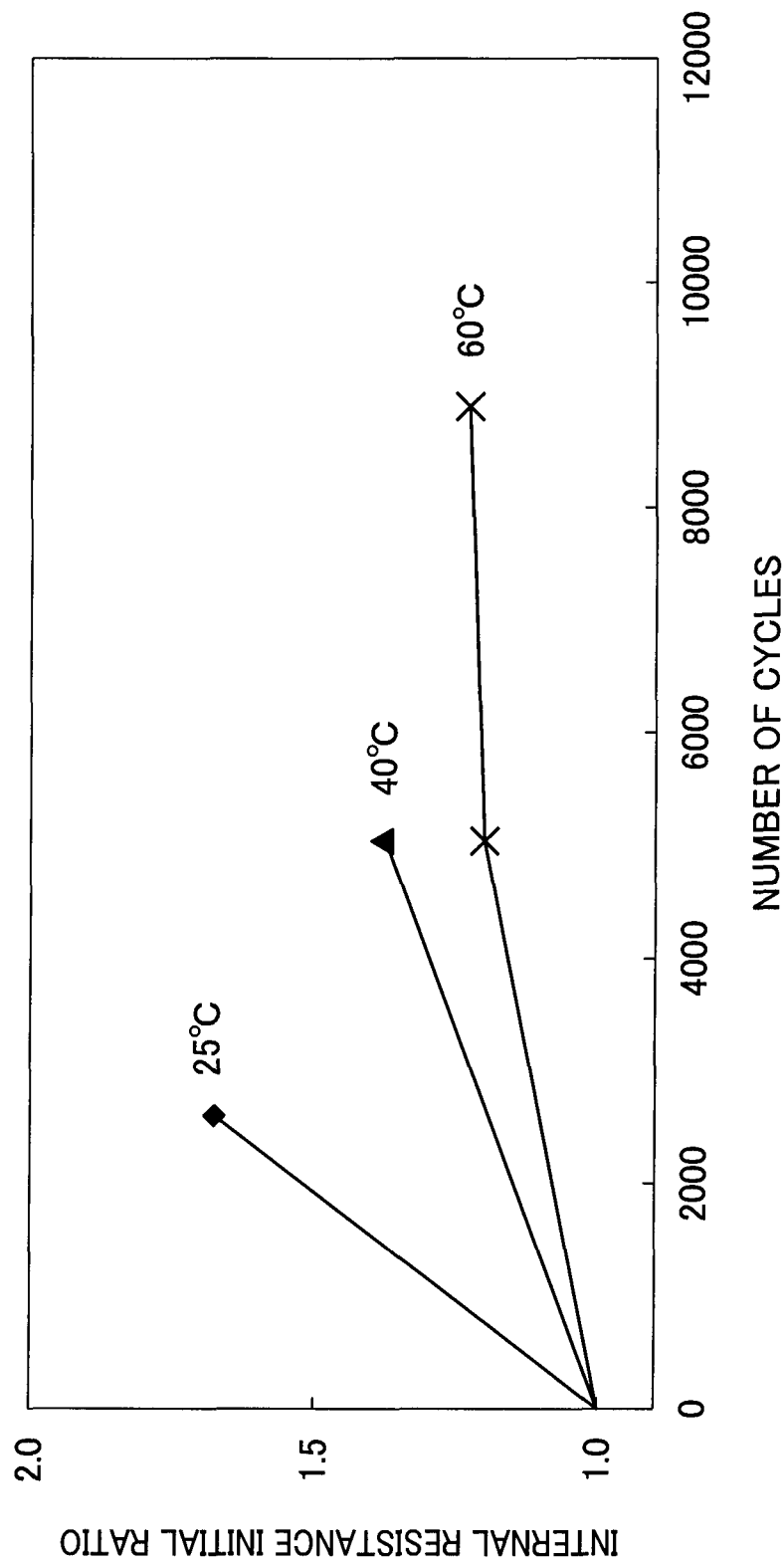
FIG. 19 is a graph showing a relationship between the number of charge-discharge cycles and an initial ratio of internal resistance of the battery.

In the above charge-discharge cycle test, the internal resistance initial ratio of each of the batteries A, B, and C measured at every predetermined number of cycles is plotted in a graph of FIG. 19. The internal resistance initial ratio of each of the batteries A, B, and C is obtained by normalizing the internal resistance values of the battery A and others at each time with reference to the initial internal resistance values of the batteries A, B, and C before the charge-discharge cycle test, as with the aforementioned first embodiment.

As is found from FIG. 19, when the battery B and the battery C are compared in internal resistance initial ratio at 5000 cycles, the battery B has a larger internal resistance initial ratio than the battery C under the condition of the same number of charge-discharge cycles. This graph shows that when the environmental temperature of the battery is set at 40° C. lower than 60° C., the internal resistance initial ratio of that battery increases.

Comparison between the battery A and the battery B reveals that when the environmental temperature of the battery is set at 25° C. lower than 40° C., the internal resistance initial ratio of that battery increases.

The above result provides that, in the temperature range of at least 25° C. to 60° C., as the environmental temperature of the battery is lower, the internal resistance initial ratio of that battery is larger. That is, the increase in internal resistance of the battery (deterioration at high rate) is induced.

Furthermore, the assembled battery 400X in the third modified embodiment is charged and discharged and a minimum-temperature battery MN having a minimum temperature among the batteries constituting the assembled battery 400X is checked. This battery is found as one placed in a left corner in the depth direction in FIG. 16.

In the third modified embodiment, therefore, this minimum-temperature battery MN is used as the above battery 1 (101, 301). In this assembled battery 400X, accordingly, the concentration of the electrolyte 30 (the stored electrolyte 30S and the retained electrolyte 30S) in the minimum-temperature battery MN tending to deteriorate at a highest rate can be measured. Consequently, the degree of high-rate deterioration in this minimum-temperature battery MN can be obtained and further the degree of high-rate deterioration of other batteries 2 used in the assembled battery 400X can be appropriately estimated because it is expected to be lower than the degree of deterioration of the minimum-temperature battery MN (the battery 1 (101, 301)).

Third Embodiment

Figure 20:
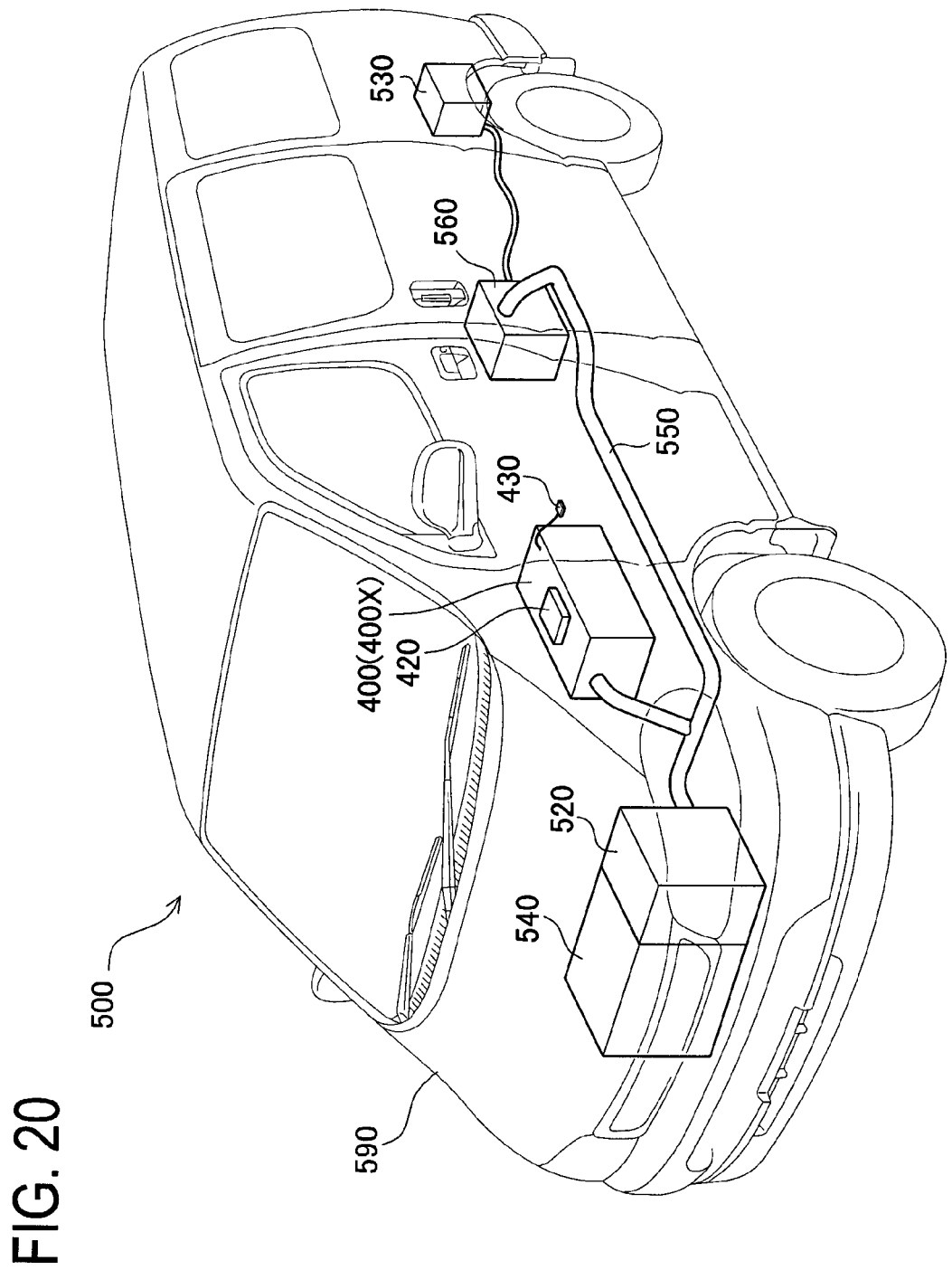
FIG. 20 is an explanatory view of a vehicle in the third embodiment.

A vehicle 500 in a third embodiment mounts the assembled battery 400 in the aforementioned second embodiment (or the assembled battery 400X in the third modified embodiment). Specifically, as shown in FIG. 20, the vehicle 500 is a hybrid electric vehicle to be driven by a combination of an engine 540, a front motor 520, and a rear motor 530. This vehicle 500 includes a vehicle body 590, the engine 540, the front motor 520 attached to the engine 540, the rear motor 530, a cable 550, an inverter 560, and the assembled battery 400 (400X). Of the assembled battery 400 (400X) mounted in the vehicle body 590, the battery monitoring unit 420 is connected to a HV controller not shown but the connector 430 is not connected to other devices.

In the third embodiment, a part of the plurality of batteries used in the assembled battery 400 (400X) mounted in the vehicle 500 is the battery 1 (101, 301). Therefore, regarding the battery 1 (101, 301), for example, at appropriate timing such as nonuse or automobile inspection of the vehicle 500, the electromotive force or the resistance value (the current value) between the first measurement electrode 40 (140) and the second measurement electrode 50 (150) or between the negative electrode plate 22 and the negative current collector 72 and the second measurement electrode 50 (150) can be obtained through the connector 430. This makes it possible to ascertain the degree of deterioration of the battery 1 (101, 301) and further the degree of deterioration of each battery 2 constituting the assembled battery 400 (400X) by combination with the battery 1 (101, 301). In the vehicle 500 in the third embodiment, as above, whether or not the battery 1 (101, 301) and the batteries 2 constituting the assembled battery 400 (400X) have deteriorated can be easily estimated.

Fourth Embodiment

Figure 21:
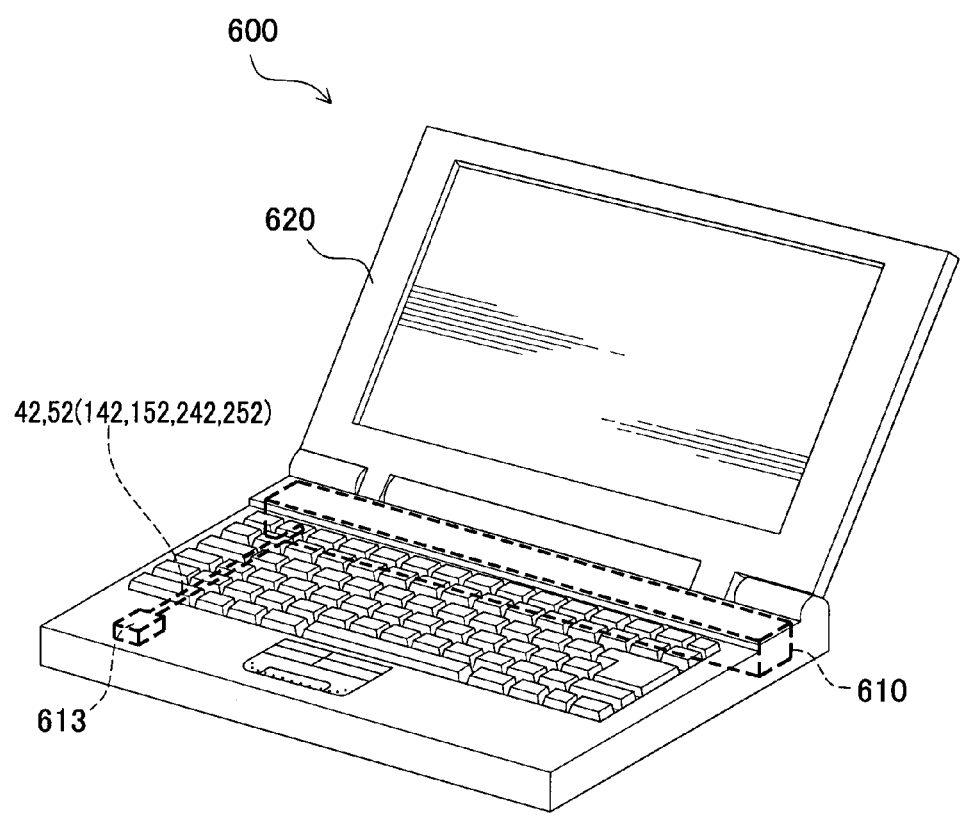
FIG. 21 is an explanatory view of a notebook-size personal computer in a fourth embodiment.

A notebook-size personal computer (hereinafter, also referred to as a notebook PC) 600 in a fourth embodiment is a battery-equipped device that mounts, in a known manner, a battery pack 610 containing the battery 1 (101, 301) in the first embodiment or the first to third modified embodiments and a main body 620, as shown in FIG. 21. The battery pack 610 is housed in the main body 620 of the notebook PC 600. The first conductive wire 42 (142) of the first measurement electrode 40 (140) and the second conductive wire 52 (152) of the second measurement electrode 50 (150) of the battery 1 (101, 301) are extended from the battery pack 610. At ends of the conductive wires 42 (142) and 52 (152), a connector 613 made of resin is attached. Inside of this connector 613, terminals (not shown) of the first conductive wire 42 (142) and second conductive wire 52 (152) are exposed in spaced relation to each other and, for example, configured to electrically connect to a conductive wire (or a connector) extending from an external measuring device, for example. In the case of the battery 301, only the second conductive wire 52 of the second measurement electrode 50 extends out of the battery pack 610.

In the fourth embodiment, a part of the plurality of lithium ion secondary batteries used in the battery pack 610 mounted in the notebook PC 600 is the battery 1 (101, 301). Accordingly, for example, at appropriate timing such as during non-use or repair and inspection of the notebook PC 600, the electromotive force or the current value (the resistance value) between the first measurement electrode 40 (140) and the second measurement electrode 50 (150) or between the negative electrode plate 22 and the negative current collector 72 and the second measurement electrode 50 (150) in the battery 1 (101, 301) can be obtained through the connector 613. This makes it possible to ascertain the degree of deterioration of the battery 1 (101, 301) and hence the degree of deterioration of other batteries 2 constituting the battery pack 610 by combination with the battery 1 (101, 301). In the notebook PC 600 in the fourth embodiment, consequently, whether or not the mounted battery 1 (101, 301) has deteriorated can be easily determined. Accordingly, whether or not the batteries 2 constituting the battery pack 610 by combination with such battery 1 (101, 301) can be easily estimated.

Fifth Embodiment

A vehicle 800 including a vehicle battery system SV1 in a fifth embodiment of the invention will be explained referring to FIGS. 22 to 25.

Figure 22:
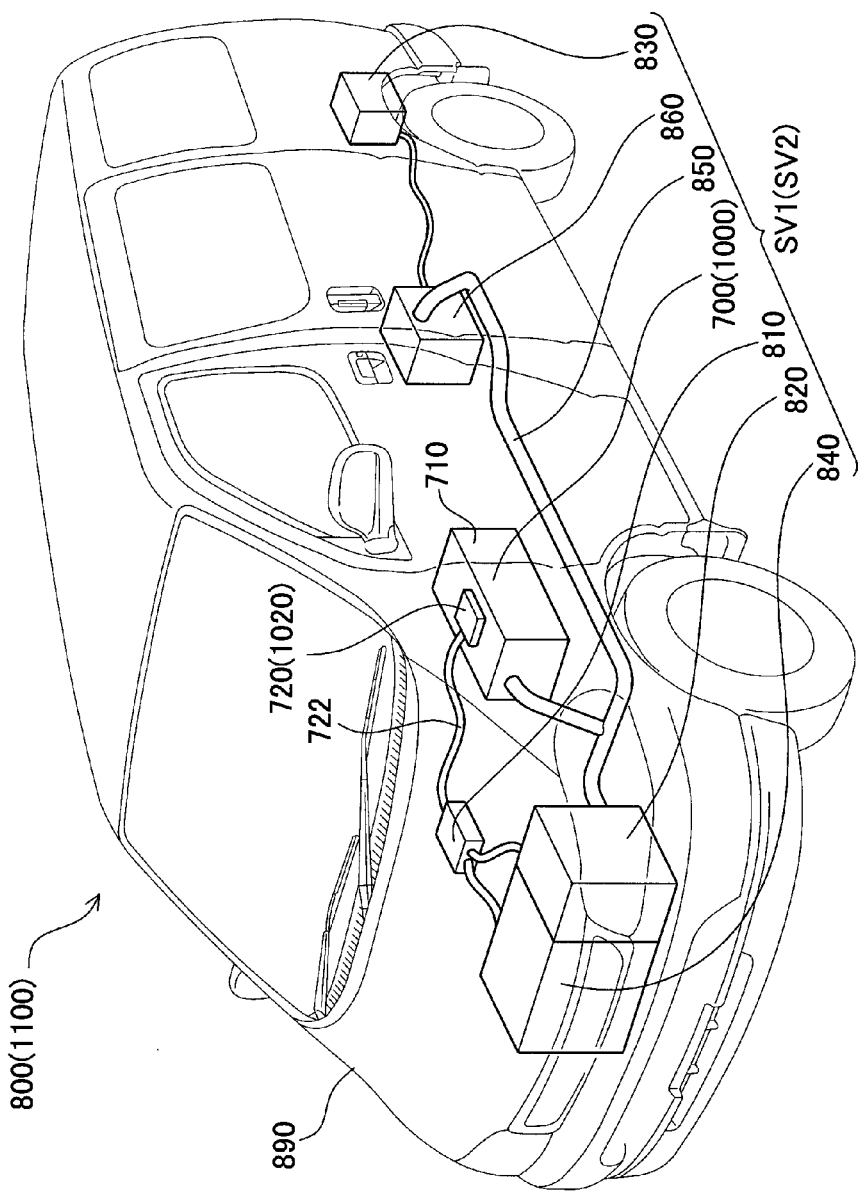
FIG. 22 is an explanatory view of a vehicle in fifth and sixth embodiments.

The vehicle 800 is a hybrid electric vehicle to be driven by a combination of an engine 840, a front motor 820, and a rear motor 830 under the control of an HV controller 810 (see FIG. 22). This vehicle 800 further includes a vehicle 890, a cable 850, an inverter 860, and an assembled battery 700 in addition to the above HV controller 810, the engine 840, the front motor 820, and the rear motor 830. The vehicle battery system SV1 in the fifth embodiment is constituted of the HV controller 810, the engine 840, the front motor 820, the rear motor 830, the cable 850, the inverter 860, and the assembled battery 700.

The HV controller 810 includes a microcomputer that has a CPU, a ROM, and a RAM, all of which are not shown, and that is activated by a predetermined program. This HV controller 810 is configured to communicate with the front motor 820, the rear motor 830, the engine 840, the inverter 860, and a battery monitoring unit 720 connected through a communication cable 722, respectively, to perform various controls according to a condition of each component. For instance, a combination of a driving force of the engine 840 and a driving force of the motors 820 and 830 are controlled to increase the fuel efficiency to a maximum extent according to a running condition of the vehicle 800. In association with that control, charge-discharge control of the assembled battery 700 is performed.

Figure 23:
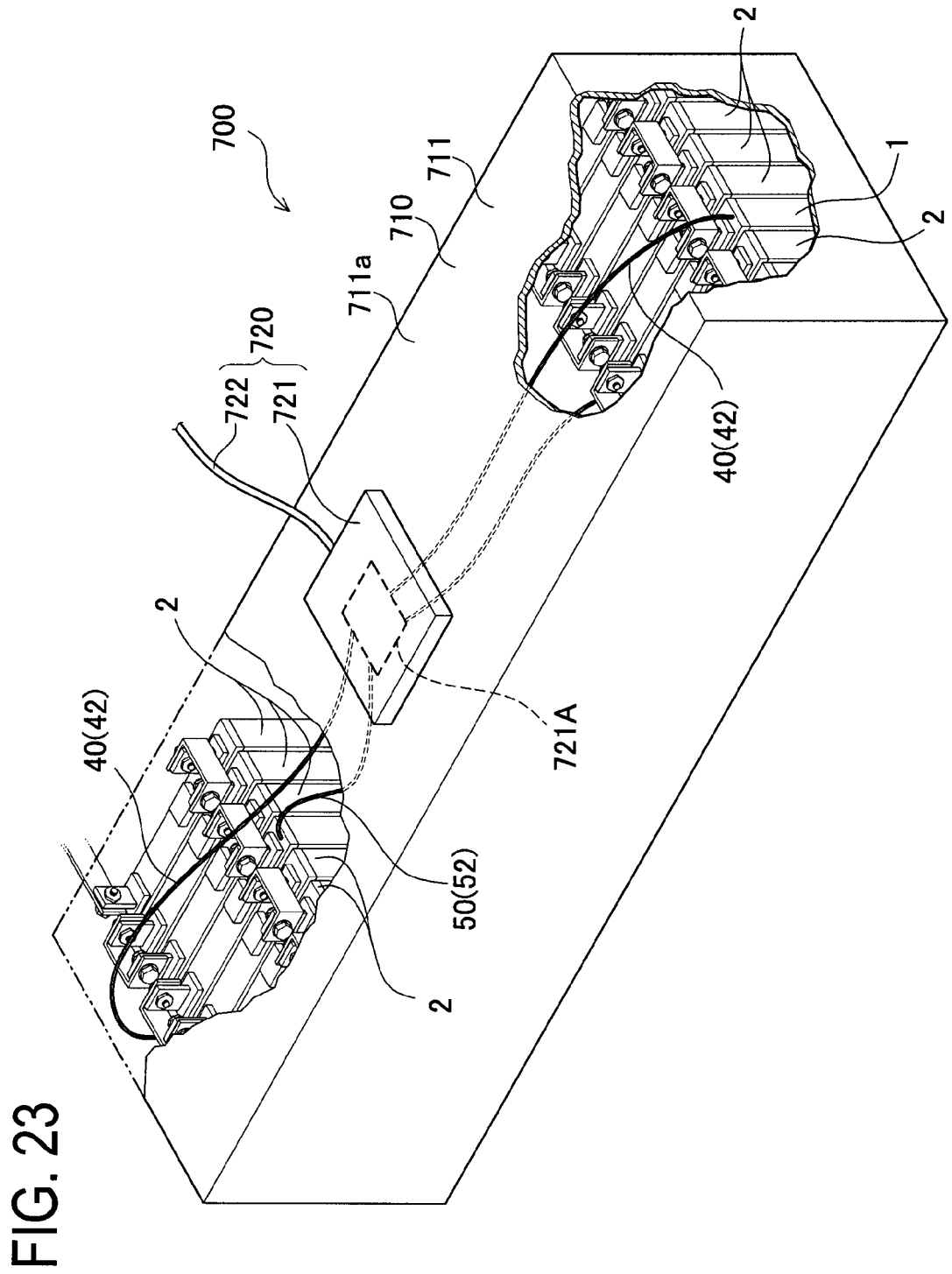
FIG. 23 is an explanatory view of an assembled battery mounted in the vehicle in the fifth embodiment.

This assembled battery 700 mounts the battery 1 shown in the aforementioned embodiment in addition to the plurality of lithium ion secondary batteries 2 having no function of measuring the concentration of the electrolyte 30 as shown in FIG. 23. This assembled battery 700 includes a battery part 710 housing the plurality of batteries 1 and 2 connected in series in an assembled battery case 711 and a battery monitoring unit 720 placed on an upper surface 711a of the case 711. The battery monitoring unit 720 includes an electromotive force acquiring circuit 721A in a main case 721 in addition to an acquiring circuit (not shown) for acquiring data on conditions (battery temperature and voltage) of the batteries 1 and 2 in the battery part 710 by use of a sensor such as a thermistor not shown.

Figure 24:
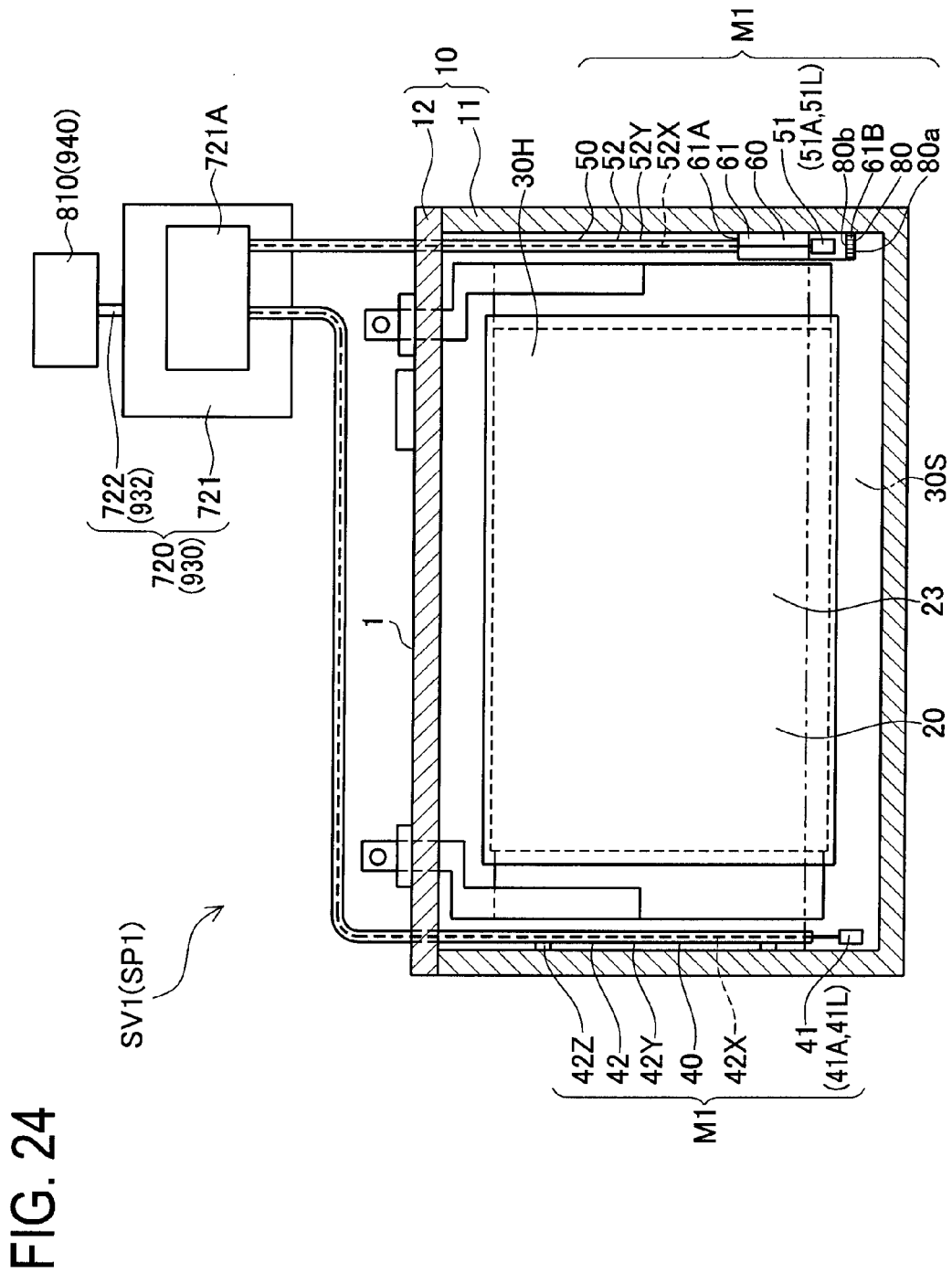
FIG. 24 is an explanatory view of a battery system in the fifth and seventh embodiments.

FIG. 24 shows only the HV controller 810, the battery monitoring unit 720, and the battery 1 of the aforementioned vehicle battery system SV1. The battery monitoring unit 720 including the electromotive force acquiring circuit 721A is connected to the HV controller 810 through the communication cable 722 as above to perform communication and also connected to the concentration-difference electromotive-force measuring means M1 of the battery 1 described in the first embodiment. To be concrete, the electromotive force acquiring circuit 721A is connected to the first conductive wire 42 of the first measurement electrode 40 and the second conductive wire 52 of the second measurement electrode 50 in the concentration-difference electromotive-force measuring means M1. The electromotive force acquiring circuit 721A therefore can acquire the electromotive force generated between the first measurement electrode 40 and the second measurement electrode 50. The acquired electromotive force is transmitted together with other battery data to the HV controller 810 through the communication cable 722.

The HV controller 810 in the vehicle battery system SV1 can determine a deterioration condition of the battery 1 based on the battery data on the electromotive force transmitted from the electromotive force acquiring circuit 721A. Based on a determination result, the HV controller 810 changes the control of the batteries 1 and 2 in the assembled battery 700.

Figure 25:
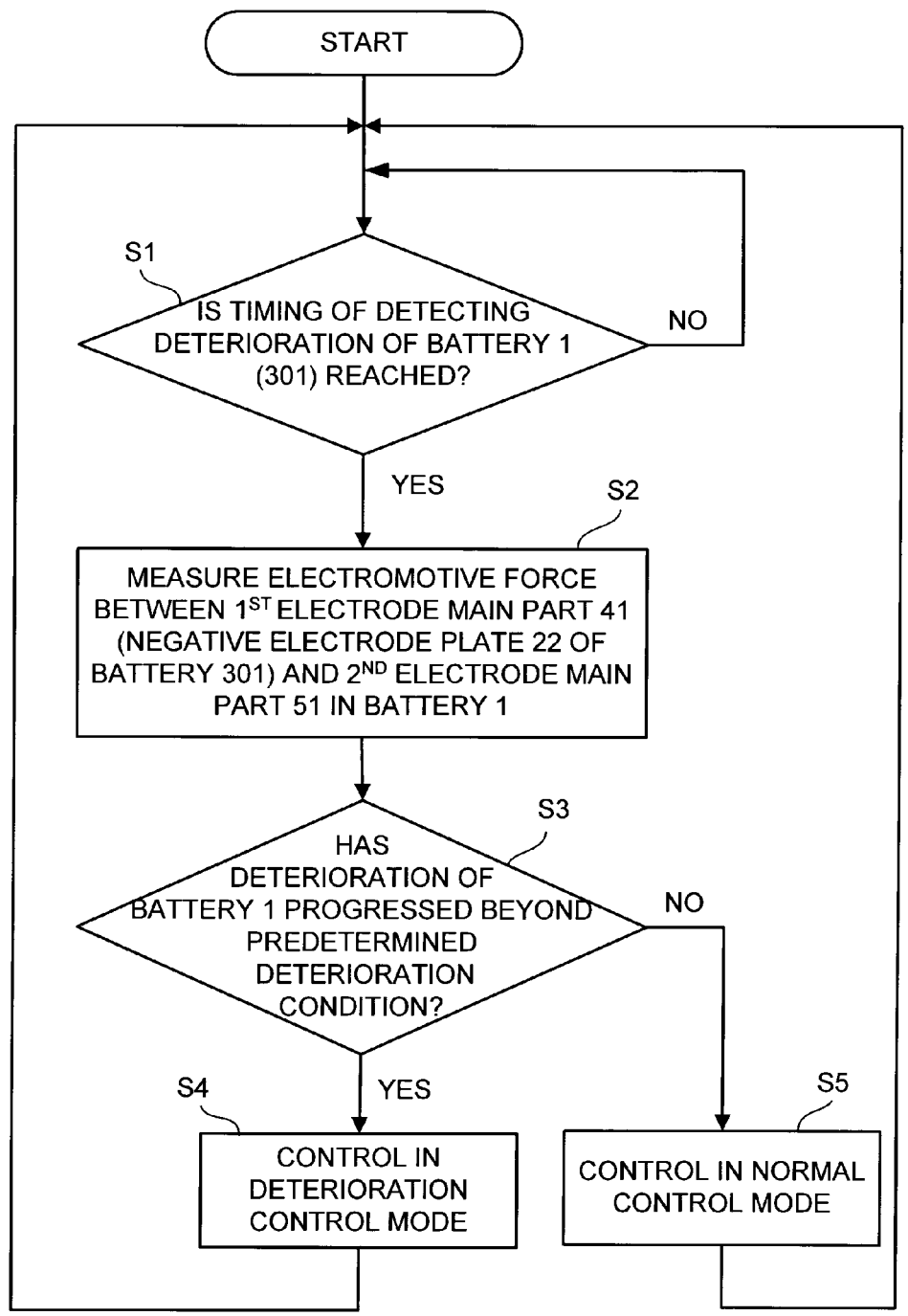
FIG. 25 is a flowchart for detecting deterioration of the battery in the fifth and seventh embodiments.

For instance, the control is conducted as shown in a flowchart in FIG. 25.

The HV controller 810 internally has a timer (not shown) to determine in step S1 whether or not the timing of detecting deterioration of the battery 1 is reached. If YES in S1, that is, if the timing of detecting deterioration of the battery 1 is reached, the flow is advanced to step S2 where the electromotive force between the first electrode main part 41 and the second electrode main part 51 is measured by use of the concentration-difference electromotive-force measuring means M1 of the battery 1. If NO in S1, on the other hand, that is, if the timing of detecting deterioration of the battery 1 is not reached, the flow is returned to step S1.

In step S2, the electromotive force between the first electrode main part 41 and the second electrode main part 51 is measured by the electromotive force acquiring circuit 721A of the battery monitoring unit 720 and a measurement value thereof is transmitted to the HV controller 810. In step S3, the HV controller 810 determines based on this measurement value whether or not deterioration of the battery 1 has progressed beyond a predetermined deterioration condition. For instance, an electromotive force value (a threshold) corresponding to the predetermined deterioration condition is stored in advance in the HV controller 810. The HV controller 810 thus determines the deterioration condition by comparing this threshold with the measurement value.

If YES in step S3, that is, if deterioration of the battery 1 has progressed beyond the predetermined deterioration condition, the flow is advanced to step S4 where the control is performed in a deterioration control mode. The deterioration control mode may include a mode of performing control according to the deterioration of each of the batteries 1 and 2 in the assembled battery 700 or performing control to prevent the progression of deterioration, for example, by restricting the level of charge current or discharge current of each of the batteries 1 and 2 in the assembled battery 700.

On the other hand, if No in step S3, that is, if deterioration of the battery 1 has not progressed beyond the predetermined deterioration condition, the flow is advanced to step S5 where the assembled battery 700 and others are controlled in a normal control mode. The normal control mode is a mode contrasted with the above deterioration control mode and a mode of performing control in a normal manner imaginable for the assembled battery 700 (the batteries 1 and 2) without particularly restricting the range of use of the assembled battery 700.

After the step S4 or step S5, the flow is returned to step S1 and the aforementioned processing is repeated.

The vehicle battery system SV1 in the fifth embodiment including the battery 1 and the electromotive force acquiring circuit 721A as above accordingly can obtain the electromotive force generated between the first measurement electrode 40 and the second measurement electrode 50 and thus easily obtain the degree of deterioration of the battery 1. Furthermore, the degree of deterioration of other batteries 2 constituting the assembled battery 700 by combination with such battery 1 can be easily ascertained. In addition, the battery 1 or the assembled battery 700 can be appropriately used according to the degree of deterioration.

The vehicle 800 in the fifth embodiment further includes the aforementioned vehicle battery system SV1. In this vehicle 800, therefore, the vehicle battery system SV1 can obtain the electromotive force of the battery 1 and detect the deterioration condition of the battery 1 or further ascertain the deterioration condition of each battery 2 and the assembled battery 700. Furthermore, the battery 1 or the assembled battery 700 can be used appropriately according to its deterioration condition.

The vehicle 800 can be configured to realize appropriate running characteristics according to the deterioration of the assembled battery 700.

The concentration-difference electromotive-force measuring means M1 corresponds to one example of a stored-electrolyte physical quantity measuring means, the vehicle battery system SV1 corresponds to one example of a battery system, and the electromotive force acquiring circuit 721A corresponds to one example of acquiring means, respectively. In the flowchart in FIG. 25, step S2 corresponds to one example of a stored electrolyte measuring step.

According to the method for detecting deterioration of the battery 1 in the fifth embodiment, including the stored electrolyte measuring step (step S2), it is possible to easily detect whether or not the battery has deteriorated by use of the lithium ion concentration of the electrolyte 30 (the stored electrolyte 30S) obtained in this measuring step.

In the stored electrolyte measuring step (step S2), the magnitude of the electromotive force generated between the first measurement electrode 40 and the second measurement electrode 50 is measured. The magnitude of this electromotive force is correlated with the lithium ion concentration of the stored electrolyte 30S. Accordingly, based on the degree of deterioration of the battery 1 can be easily ascertained based on the magnitude of the electromotive force.

In the above fifth embodiment, the vehicle battery system SV1 includes the battery 1 in the first embodiment in the assembled battery 700. Alternatively, for example, the battery 101 in the first modified embodiment may be used. However, in the case of using the battery 101, the battery monitoring unit 720 includes the stored electrolyte resistance measuring means M2 instead of the electromotive force acquiring circuit 721A and uses the stored-electrolyte resistance acquiring circuit to acquire a resistance value between the first electrode main part 141 and the second electrode main part 151. At that time, the stored electrolyte resistance measuring means M2 corresponds to one example of the stored-electrolyte physical quantity measuring means, and the stored-electrolyte resistance acquiring circuit corresponds to one example of the acquiring means.

Sixth Embodiment

A vehicle 1100 including a vehicle battery system SV2 in a sixth embodiment of the invention will be described referring to FIGS. 22, 25 to 27.

The vehicle in the sixth embodiment is different from the vehicle in the fifth embodiment in that the vehicle battery system SV2 contains the concentration-difference electromotive-force measuring means M4 of the battery 301 mentioned in the third modified embodiment.

The vehicle 1100 in the sixth embodiment is a hybrid electric vehicle to be driven by a combination of an engine 840, a front motor 820, and a rear motor 830 under the control of an HV controller 810 identical to that in the fifth embodiment (see FIG. 22). The vehicle battery system SV2 in the sixth embodiment is constituted, as shown in FIG. 22, of the HV controller 810, the engine 840, the front motor 820, the rear motor 830, a cable 850, an inverter 860, and an assembled battery 1000.

Figure 26:
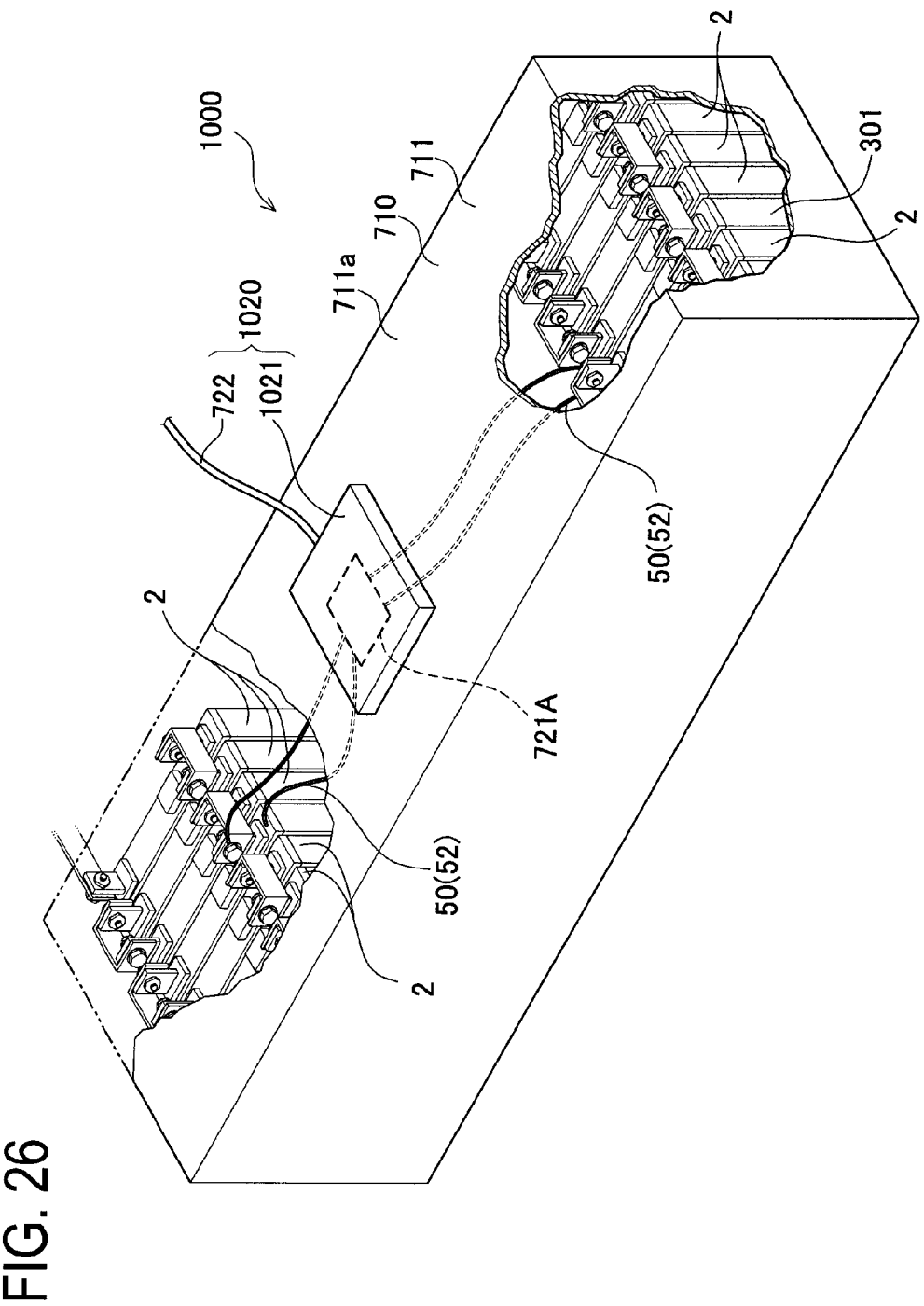
FIG. 26 is an explanatory view of an assembled battery mounted in the vehicle in the sixth embodiment.

The assembled battery 1000 mounts the battery 301 described in the above third modified embodiment in addition to the aforementioned batteries 2 as shown in FIG. 26. This assembled battery 1000 includes, as with the fifth embodiment, a battery part 710 housing a plurality of the batteries 2 and the battery 301 connected in series in an assembled battery case 711, and a battery monitoring unit 1020 placed on an upper surface 711a of the case 711.

Figure 27:
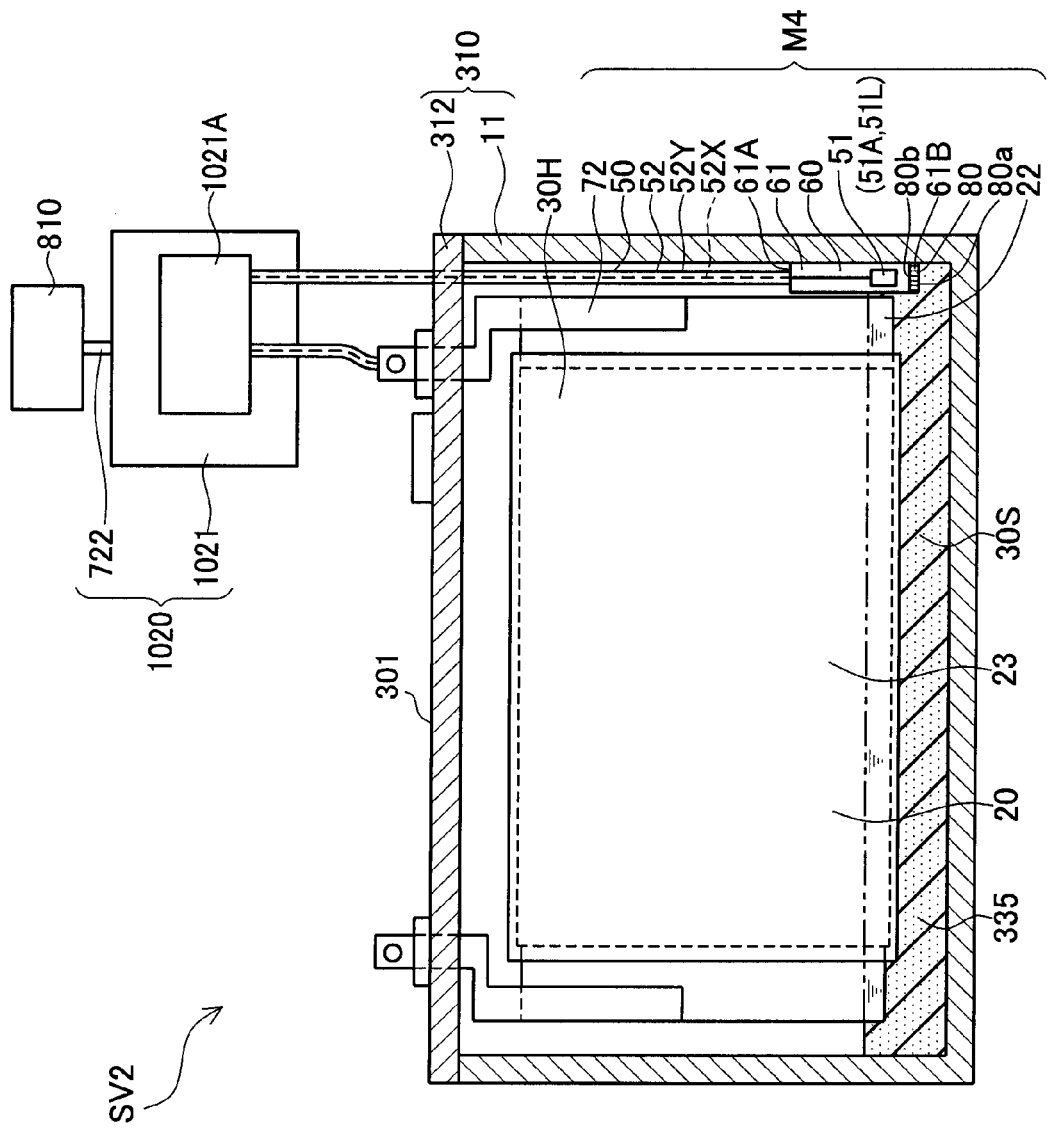
FIG. 27 is an explanatory view of a battery system in the sixth embodiment.

FIG. 27 shows only the HV controller 810, the battery monitoring unit 1020, and the battery 301 of the vehicle battery system SV2. The battery monitoring unit 1020 including an electromotive force acquiring circuit 1021A is connected to the HV controller 810 through a communication cable 722 to perform communication as with the fifth embodiment. However, differently from the fifth embodiment, the battery monitoring unit 1020 is connected to the concentration-difference electromotive-force measuring means M4 of the battery 301 in the second modified embodiment.

To be concrete, the electromotive force acquiring circuit 1021A is connected to the negative current collector 72 and the second conductive wire 52 of the second measurement electrode 50 in the concentration-difference electromotive-force measuring means M4. The electromotive force acquiring circuit 1021A can therefore obtain the electromotive force between the negative electrode plate 22 and the second electrode main part 51 of the second measurement electrode 50. The obtained electromotive force is transmitted together with other battery data to the HV controller 810 through the communication cable 722 in a similar way to the fifth embodiment.

The HV controller 810 in the vehicle battery system SV2 can determine the deterioration condition of the battery 301 based on battery data on the electromotive force transmitted from the electromotive force acquiring circuit 1021A in a similar way to the fifth embodiment. Based on the determination result, the HV controller 810 controls the batteries 2 and the battery 301 in the assembled battery 1000 according to the flowchart in FIG. 25 in a similar manner to the fifth embodiment. The flowchart in FIG. 25 is the same as with the fifth embodiment and thus the explanation thereof is not repeated here.

Seventh Embodiment

Figure 28:
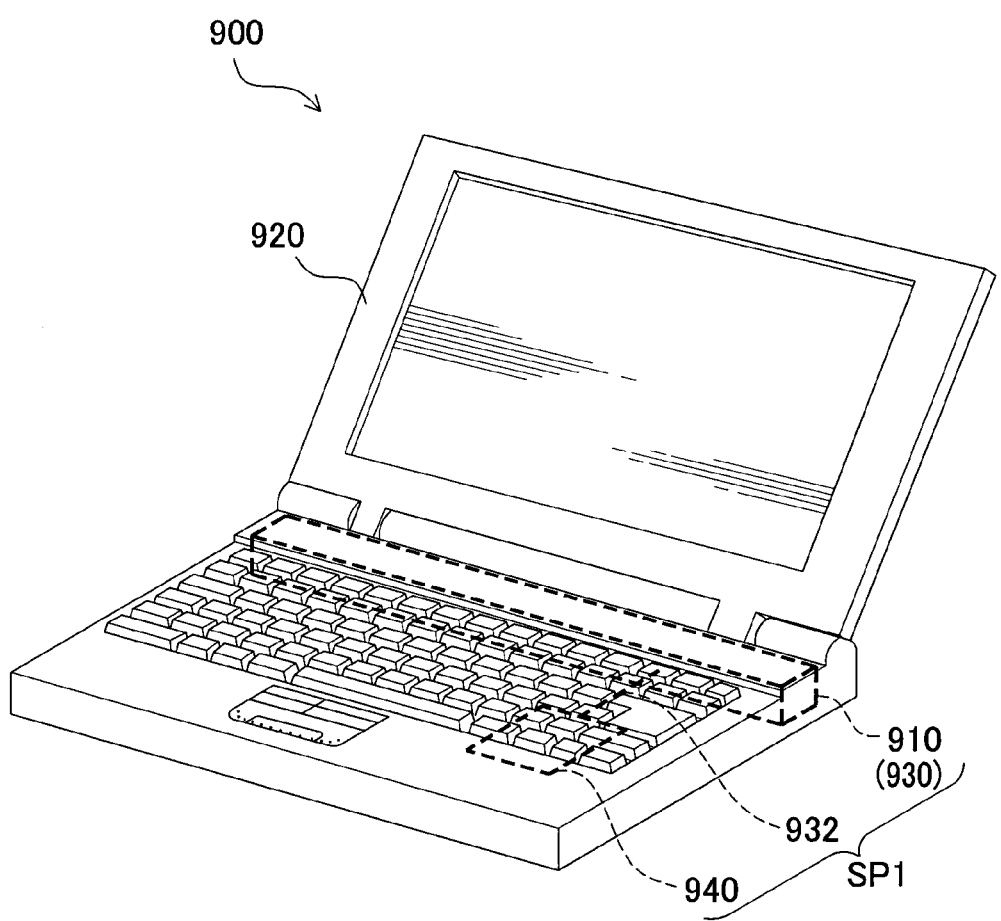
FIG. 28 is an explanatory view of a notebook-size personal computer in the seventh embodiment.

A notebook-size personal computer (hereinafter, also referred to as a notebook PC) 900 including a PC battery system SP1 in a seventh embodiment of the invention will be explained referring to FIG. 28.

The notebook PC 900 is a battery-equipped device including a CPU 940, a memory (not shown), a battery pack 910, a battery monitoring unit 930 built in that battery pack 910, and a main body 920. The PC battery system SP1 in the seventh embodiment is constituted of the CPU 940, the memory (not shown), the battery pack 910, and the battery monitoring unit 930.

The CPU 940 is configured to communicate with the battery pack 910 having a circuit not shown and a communication cable 932 and read a program previously installed in the memory and process the program at higher speed, for example execute a charge-discharge control program to the battery pack 910.

The battery pack 910 mounts the battery 1 described in the first embodiment in addition to the lithium ion secondary batteries 2 having no function of measuring the concentration of the electrolyte 30 as with the fifth embodiment. This battery pack 910 internally includes a battery monitoring unit 930 in addition to the batteries 1 and 2 connected in series. The battery monitoring unit 930 includes an electromotive force acquiring circuit 721A in addition to an acquiring circuit (not shown) for acquiring data on the conditions (battery temperature and voltage) of the batteries 1 and 2 in the battery pack 910 by use of a sensor such as a thermistor not shown.

FIG. 24 shows only the CPU 940, the battery monitoring unit 930, and battery 1 in the aforementioned PC battery system SP1. The battery monitoring unit 930 including the electromotive force acquiring circuit 721A is connected to the CPU 940 through the communication cable 932 as above to perform communication and also connected to the concentration-difference electromotive-force measuring means M1 of the battery 1.

To be concrete, the electromotive force acquiring circuit 721A is connected to the first conductive wire 42 of the first measurement electrode 40 and the second conductive wire 52 of the second measurement electrode 50 in the concentration-difference electromotive-force measuring means M1. The electromotive force acquiring circuit 721A can therefore acquire the electromotive force generated between the first measurement electrode 40 and the second measurement electrode 50. The acquired electromotive force is transmitted together with other battery data to the CPU 940 through the communication cable 932.

The CPU 940 of the PC battery system SP1 can determine the deterioration condition of the battery 1 based on the battery data received from the electromotive force acquiring circuit 721A. Based on the determination result, the CPU 940 changes the control of the batteries 1 and 2 in the battery pack 910.

For instance, the control is performed according to the flowchart shown in FIG. 25 as with the fifth embodiment.

The PC battery system SP1 in the seventh embodiment includes the battery 1 and the electromotive force acquiring circuit 721A as above and thus can acquire the electromotive force generated between the first measurement electrode 40 and the second measurement electrode 50, thereby easily obtaining the degree of deterioration of this battery 1. Hence, the degree of deterioration of the batteries 2 constituting the battery pack 910 by combination with the battery 1 can be easily ascertained. Furthermore, the battery 1 or the batteries 2 in the battery pack 910 can be used appropriately according to respective deterioration conditions.

The notebook PC 900 in the seventh embodiment includes the aforementioned PC battery system SP1. In this notebook PC 900, therefore, the PC battery system SP 1 can obtain the electromotive force of the battery 1 and detect the deterioration condition of the battery 1, or further ascertain the deterioration condition of the batteries 2 and the battery pack 910. Further, the battery 1 or the batteries 2 in the battery pack 910 can be used appropriately according to respective deterioration conditions.

Consequently, the notebook PC 900 can be configured to appropriately perform charge or discharge of the battery pack 910 according to the deterioration condition thereof.

The PC battery system SP1 corresponds to one example of a battery system.

As with the fifth embodiment, the PC battery system SP 1 may use the battery 101 of the first modified embodiment, or the battery 301 of the second modified embodiment, instead of the battery 1. In the case of using the battery 101, however, the stored-electrolyte resistance acquiring circuit is used instead of the electromotive force acquiring circuit 721A to acquire a resistance value between the first electrode main part 141 and the second electrode main part 151. In the case of using the battery 301, the electromotive force acquiring circuit 1021A is used to measure the battery caused between the negative electrode plate 22 and the second electrode main part 51.

The invention is described as above referring to the first to seventh embodiments and first to third modified embodiments, but is not limited to the above embodiments. The invention may be embodied in other specific forms without departing from the essential characteristics thereof.

For instance, the battery in the above embodiments and others is the wound-type lithium ion secondary battery but may be a laminated-type lithium ion secondary battery in which a plurality of positive electrode plates and a plurality of negative electrode plates are alternately laminated by interposing a separator therebetween. Furthermore, the above embodiments use the electromotive force or the resistance value (the current value) between the first measurement electrode and the second measurement electrode as the concentration correlated physical quantity. Alternatively, for example, the magnitude of voltage generated between the first measurement electrode and the second measurement electrode corresponding to the lithium ion concentration of the electrolyte may be used by passing a constant current between the electrodes.

In the first embodiment, the filter 80 made of a porous glass plate is used as the separating member. Alternatively, any other member may be used as long as it can prevent ion migration resulting from a concentration difference between the stored electrolyte and the reference electrolyte and also measure a potential between the stored electrolyte 30S and the reference electrolyte 60 by the first measurement electrode 40 and the second measurement electrode 50. For example, ceramics or resin having such characteristics may also be adopted.

The invention claimed is:

1. A lithium ion secondary battery comprising:
a power generating element having a positive electrode plate and a negative electrode plate;
a battery case housing the power generating element; and
an electrolyte containing lithium ions, the electrolyte being retained in the battery case,
wherein the electrolyte includes:
a retained electrolyte as a part retained between the positive electrode plate and the negative electrode plate in the power generating element; and
a stored electrolyte as another part stored between the power generating element and the battery case so that the stored electrolyte and the retained electrolyte are allowed to communicate with each other,
the lithium ion secondary battery comprises stored-electrolyte physical quantity measuring means capable of measuring a concentration correlated physical quantity having a correlation with a concentration of the lithium ions in the stored electrolyte
wherein the stored-electrolyte physical quantity measuring means comprises:
a first measurement electrode including a first electrode main part contacting the stored electrolyte and a first conductive part exposed to the outside of the battery case and electrically connected to the first electrode main part;
a reference electrolyte containing lithium ions of a reference concentration;
a reference electrolyte container containing the reference electrolyte;
a second measurement electrode including a second electrode main part contacting the reference electrolyte and a second conductive part exposed to the outside of the reference electrolyte container and electrically connected to the second electrode main part; and
a separating member having a first surface that contacts with the stored electrolyte and a second surface that contacts with the reference electrolyte to separate the stored electrolyte and the reference electrolyte from each other, the separating member being arranged to prevent ion migration between the first and second surfaces resulting from a concentration difference between the stored electrolyte and the reference electrolyte and to enable measuring of a voltage generated between the reference electrolyte and the stored electrolyte by the first and second measurement electrodes.

2. The lithium ion secondary battery according to claim 1, comprising a liquid retaining member for retaining the stored electrolyte so as to communicate with the retained electrolyte even when the lithium ion secondary battery is placed at a slant and so as to contact with a contact-requiring portion of the stored-electrolyte physical quantity measuring means required to contact with the stored electrolyte.

3. An assembled battery comprising a plurality of lithium ion secondary batteries, wherein
at least one of the lithium ion secondary batteries is the lithium ion secondary battery with the measuring means set forth in claim 1.

4. A vehicle comprising the lithium ion secondary battery set forth in claim 1, the battery being mounted on the vehicle.

5. A battery-equipped device comprising the lithium ion secondary battery set forth in claim 1, the battery being mounted on the battery-equipped device.

6. A battery system comprising:
the lithium ion secondary batteries with the measuring means set forth in claim 1; and
acquiring means for acquiring the concentration correlated physical quantity by use of the stored-electrolyte physical quantity measuring means.

7. The battery system according to claim 6, comprising an assembled battery having a plurality of lithium ion secondary batteries including the lithium ion secondary battery with the measuring means.

8. A vehicle comprising the battery system set forth in claim 7, the battery system being mounted on the vehicle.

9. A battery-equipped device comprising the battery system set forth in claim 7, the battery system being mounted on the battery-equipped device.

10. A vehicle comprising the assembled battery set forth in claim 3, the assembled battery being mounted on the vehicle.

11. A battery-equipped device comprising the assembled battery set forth in claim 3, the assembled battery being mounted on the battery-equipped device.

* * * * *